United States Patent
Han et al.

(10) Patent No.: US 11,961,735 B2
(45) Date of Patent: Apr. 16, 2024

(54) CYCLIC PLASMA PROCESSING

(71) Applicant: Tokyo Electron Limited, Tokyo (JP)

(72) Inventors: Yun Han, Albany, NY (US); Caitlin Philippi, Albany, NY (US); Andrew Metz, Albany, NY (US); Alok Ranjan, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 139 days.

(21) Appl. No.: 17/339,495

(22) Filed: Jun. 4, 2021

(65) Prior Publication Data
US 2022/0392765 A1 Dec. 8, 2022

(51) Int. Cl.
| | |
|---|---|
| H01L 21/02 | (2006.01) |
| C23C 16/04 | (2006.01) |
| C23C 16/32 | (2006.01) |
| C23C 16/42 | (2006.01) |

(52) U.S. Cl.
CPC ........ H01L 21/02274 (2013.01); C23C 16/04 (2013.01); C23C 16/32 (2013.01); C23C 16/42 (2013.01); H01L 21/02115 (2013.01); H01L 21/0212 (2013.01); H01L 21/02123 (2013.01); H01L 21/02178 (2013.01)

(58) Field of Classification Search
CPC ......... H01L 21/02274; H01L 21/02178; H01L 21/02115; H01L 21/0212; H01L 21/02123; H01L 21/3065; H01L 21/30655; H01L 21/308; H01L 21/3081; H01L 21/3083; H01L 21/3086; H01L 21/3088; C23C 16/32; C23C 16/42

See application file for complete search history.

(56) References Cited

U.S. PATENT DOCUMENTS

| | | | |
|---|---|---|---|
| 5,976,988 A | 11/1999 | Konuma et al. | |
| 6,071,809 A * | 6/2000 | Zhao | H01L 23/5329 438/645 |
| 6,211,092 B1 * | 4/2001 | Tang | H01L 21/76807 438/719 |
| 6,617,253 B1 * | 9/2003 | Chu | H01L 21/76802 257/E21.252 |
| 6,635,184 B1 | 10/2003 | Cohen et al. | |

(Continued)

OTHER PUBLICATIONS

F. Roozeboom et al., Cyclic Etch/Passivation-Deposition as an All-Spatial Concept toward High-Rate Room Temperature Atomic Layer Etching, 2015 ECS J. Solid State Sci. Technol. 4 N5067.*

*Primary Examiner* — Yara B Green
*Assistant Examiner* — Fakeha Sehar
(74) *Attorney, Agent, or Firm* — Slater Matsil, LLP

(57) ABSTRACT

A method for processing a substrate includes performing a cyclic plasma process including a plurality of cycles, each cycle of the plurality of cycles including purging a plasma processing chamber including the substrate with a first deposition gas including carbon. The substrate includes a first layer including silicon and a second layer including a metal oxide. The method further includes exposing the substrate to a first plasma generated from the first deposition gas to selectively deposit a first polymeric film over the first layer relative to the second layer; purging the plasma processing chamber with an etch gas including fluorine; and exposing the substrate to a second plasma generated from the etch gas to etch the second layer.

20 Claims, 13 Drawing Sheets

(56) References Cited

U.S. PATENT DOCUMENTS

| | | | | |
|---|---|---|---|---|
| 6,720,249 B1* | 4/2004 | Dalton | | H01L 21/76813 |
| | | | | 438/692 |
| 6,905,968 B2* | 6/2005 | Hsieh | | H01L 21/76808 |
| | | | | 257/E21.252 |
| 6,916,746 B1* | 7/2005 | Hudson | | H01L 21/31116 |
| | | | | 438/712 |
| 7,125,792 B2* | 10/2006 | Kumar | | H01L 21/76835 |
| | | | | 257/E21.252 |
| 7,169,695 B2* | 1/2007 | Huang | | H01L 21/31144 |
| | | | | 438/626 |
| 9,034,198 B2* | 5/2015 | Nakagawa | | H01J 37/32091 |
| | | | | 216/51 |
| 9,595,451 B1* | 3/2017 | Zhou | | H01L 21/31116 |
| 9,659,955 B1 | 5/2017 | Sharangpani et al. | | |
| 9,859,153 B1* | 1/2018 | Rainville | | C23C 16/52 |
| 10,211,065 B2* | 2/2019 | Wang | | H01J 37/32082 |
| 11,004,734 B2* | 5/2021 | Tung | | H01L 21/76816 |
| 2003/0044725 A1* | 3/2003 | Hsue | | H01L 21/76811 |
| | | | | 430/311 |
| 2004/0072430 A1* | 4/2004 | Huang | | H01L 21/76808 |
| | | | | 257/E21.252 |
| 2005/0056615 A1* | 3/2005 | Moll | | H01L 21/31122 |
| | | | | 257/E21.253 |
| 2005/0211668 A1* | 9/2005 | Pandhumsoporn | | |
| | | | | H01L 21/30655 |
| | | | | 216/41 |
| 2007/0026677 A1* | 2/2007 | Ji | | H01L 21/0337 |
| | | | | 438/689 |
| 2016/0013067 A1* | 1/2016 | Wang | | H01L 21/32136 |
| | | | | 438/702 |
| 2017/0140930 A1* | 5/2017 | Kao | | H01L 21/02274 |
| 2017/0243757 A1* | 8/2017 | Ranjan | | H01L 21/02252 |
| 2018/0315650 A1* | 11/2018 | Ren | | H01L 23/5226 |
| 2019/0157145 A1* | 5/2019 | Ren | | H01L 21/76826 |
| 2020/0388533 A1* | 12/2020 | You | | H01L 21/76877 |
| 2021/0043506 A1* | 2/2021 | Shaviv | | H01L 21/76865 |
| 2021/0407801 A1* | 12/2021 | Venkatasubramanian | | |
| | | | | C23C 16/272 |

* cited by examiner

CYCLIC PLASMA PROCESSING

TECHNICAL FIELD

The present invention relates generally to a system and method of processing a semiconductor device, and, in particular embodiments, to a systems and methods for cyclic plasma processing.

BACKGROUND

Generally, a semiconductor device, such as an integrated circuit (IC) is fabricated by sequentially depositing and patterning layers of dielectric, conductive, and semiconductor materials over a substrate to form a network of electronic components and interconnect elements (e.g., transistors, resistors, capacitors, metal lines, contacts, and vias) integrated in a monolithic structure. Processing flows used to form the constituent structures of semiconductor devices involve depositing and removing a variety of materials. For these purposes, various plasma processes are often used in semiconductor device fabrication.

Plasma etching, a type of plasma processes, is a common technique to etch materials by exposing them to a plasma of a gas comprising charged species, neutral species, or combination thereof. In plasma etching, etch selectivity and directionality (anisotropic or isotropic) are the important key characteristics that determine process performance. As innovations in semiconductor industry continue to introduce new materials and device architectures, further developments in plasma etching processes, in particular for improving selectivity and directionality, are desired to meet increasing requirements in semiconductor device manufacturing.

SUMMARY

In accordance with a preferred embodiment of the present invention, a method for processing a substrate that includes performing a cyclic plasma process including a plurality of cycles, each cycle of the plurality of cycles including purging a plasma processing chamber including the substrate with a first deposition gas including carbon, the substrate including a first layer including silicon and a second layer including a metal oxide; exposing the substrate to a first plasma generated from the first deposition gas to selectively deposit a first polymeric film over the first layer relative to the second layer; purging the plasma processing chamber with an etch gas including fluorine; and exposing the substrate to a second plasma generated from the etch gas to etch the second layer.

In accordance with a preferred embodiment of the present invention, a method of processing a substrate that includes performing a cyclic plasma process including a plurality of cycles, one cycle of the plurality of cycles including: applying, during a first time interval, a first source power to a source electrode of a plasma processing chamber and a first bias power to a bias electrode of the plasma processing chamber and flowing a deposition gas including carbon into the plasma processing chamber to selectively deposit a polymeric film over a silicon-containing layer relative to a metal oxide layer; purging, during a second time interval, the plasma processing chamber with an etch gas including fluorine; and applying, during a third time interval, a second source power to the source electrode and a second bias power to the bias electrode and flowing the etch gas into the plasma processing chamber to etch the metal oxide layer, the first layer being covered under the polymeric film during the third interval.

In accordance with a preferred embodiment of the present invention, a method for processing a substrate that includes performing a cyclic plasma process including a plurality of cycles, each cycle of the plurality of cycles including: purging a plasma processing chamber including the substrate with a deposition gas including carbon, the substrate including a hard mask and an interlevel dielectric (ILD) layer patterned over a metal oxide etch stop layer (ESL) covering a metal line, the hard mask, the ILD layer, and the metal oxide ESL including an outer exposed surface; performing an area-selective plasma deposition process by exposing the substrate to a first plasma generated from the deposition gas to deposit a polymeric film preferentially over the hard mask and the ILD layer relative to the metal oxide ESL; purging the plasma processing chamber with an etch gas including fluorine; and performing an etching process by exposing the substrate to a second plasma generated from the etch gas to preferentially etch the metal oxide ESL relative to the hard mask and the ILD layer.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1A-1M illustrate cross-sectional views of a substrate at various intermediate stages of fabrication in a dual damascene back-end-of-line (BEOL) processing flow undergoing a cyclic plasma process (FIGS. 1G-1I), in accordance with various embodiments, wherein FIG. 1A illustrates the incoming substrate, FIG. 1B illustrates after a trench etch, FIG. 1C illustrates after a trench refill, FIG. 1D illustrates after a photoresist patterning, FIG. 1E illustrates after a via etch, FIG. 1F illustrates after an removal of a top blocking layer, FIG. 1G illustrate after an area-selective plasma deposition process, FIG. 1H illustrates after an etch of an etch stop layer (ESL), FIG. 1I illustrates after the completion of the cyclic plasma process, FIG. 1J illustrates after a removal of a bottom blocking layer, FIG. 1K illustrates after a diffusion barrier layer deposition, FIG. 1L illustrates after a metallization, and FIG. 1M illustrates after a planarization;

FIGS. 2A-2E illustrate cross-sectional views of a substrate at various intermediate stages of fabrication in a dual damascene BEOL processing flow undergoing a cyclic plasma process in accordance with alternate embodiments, wherein FIG. 2A illustrates the incoming substrate, FIG. 2B illustrates after a via etch, FIG. 2C illustrates after a via refill, FIG. 2D illustrates after a photoresist patterning, and FIG. 2E illustrates after a trench etch;

FIGS. 3A-3C illustrate cross-sectional views of a substrate undergoing a cyclic plasma process in accordance with different embodiments, wherein FIG. 3A illustrates the substrate after a first area-selective plasma deposition process, FIG. 3B illustrates after a second area-selective plasma deposition process, and FIG. 3C illustrates after an etch of an etch stop layer (ESL);

FIGS. 4A-4D illustrate flow diagrams of a cyclic plasma process in accordance with various embodiments, wherein FIG. 4A illustrates a cyclic plasma process in accordance with the embodiments described in FIGS. 1G-1I, FIG. 4B illustrates a dual damascene BEOL process comprising a cyclic plasma process (trench-first), in accordance with the example embodiments described in FIGS. 1A-1M, FIG. 4C illustrates another dual damascene BEOL process comprising a cyclic plasma process (via-first), in accordance with the alternate embodiments described in FIGS. 2A-2E and 1F-1M, and FIG. 4D illustrates a cyclic plasma process, in accordance with the other alternates embodiment described in FIGS. 3A-3C;

FIGS. 5A and 5B illustrate an embodiment method of a cyclic plasma process in a plasma processing tool, wherein FIG. 5A illustrates a timing diagram for one cycle of a time-multiplexed implementation of the cyclic plasma process, and FIG. 5B illustrates a flow diagram of the cyclic plasma process in accordance with the embodiment in FIG. 5A;

FIGS. 7A and 7B illustrate a plasma system for performing a spatially segregated implementation of the cyclic plasma process, illustrated in the flow diagrams in FIGS. 4A-4D and 5A-5B, wherein FIG. 7A illustrates a top view and FIG. 7B illustrates a cross-sectional view.

DETAILED DESCRIPTION OF ILLUSTRATIVE EMBODIMENTS

Figure 1A:
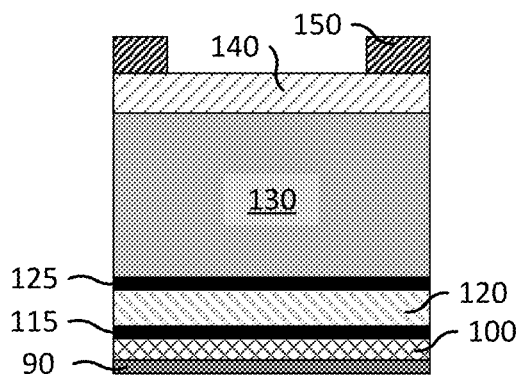

This disclosure describes embodiments of a cyclic plasma process method for selectively removing metal oxide materials relative to silicon-containing or other materials using an etch gas comprising fluorine without causing metal corrosion, as seen with corrosive etch gases. As further described below, the cyclic plasma process may be used to selectively remove an etch stop layer (ESL) comprising metal oxides such as aluminum oxide, as a part of a damascene back-end-of-line (BEOL) process of semiconductor device fabrication. The embodiments described herein provide the advantages of efficient removal of metal oxide materials while reducing the loss of other materials such as silicon-containing hard mask materials and interlevel dielectric (ILD) materials and avoiding metal corrosion. The innovative methods achieve this advantage by combining area-selective plasma deposition to form a protective layer over the silicon-containing materials and the like, and subsequent etching using a fluorine-containing non-corrosive gas to selectively remove the target metal oxide materials that have little to no protective layer, as described further in detail below. While described in the context of a copper dual damascene process in this disclosure, the cyclic plasma process may be applied to other process flows in other structures, as known to a person skilled in the art.

Generally, a dual damascene BEOL process is an important step in integrated circuit fabrication to form copper (Cu) interconnects. In the dual damascene BEOL process, a first recess such as via or trench is formed, and the first recess is filled with a temporary filling material. Next, a second recess is formed and the entire recesses formed are then filled with copper metal followed by planarization. Processes to form vias and trenches may involve the removal of etch stop layer (ESL). An ESL may be positioned between two blocking layers to separate different metal layers. While the stack of these multiple layers may be collectively called as an etch stop layer, in this disclosure, they are separately referred to as a top blocking layer, an etch stop layer (ESL), and a bottom blocking layer. Although silicon carbide and silicon nitride have been used as conventional ESL materials, aluminum oxide ($Al_2O_3$) may be preferred for ESL owing to its lower dielectric constant (k value around 4 to 6 as a thin film) and high density. The removal of aluminum oxide ESL, however, has been a challenge and conventional methods for etching aluminum oxide ESL are not satisfactory. For example, wet etch processes tend to be isotropic, which may increase the bottom critical dimensions and consequently risk via-via or via-trench shorting. Dry plasma etch using a chlorine-(Cl) or bromine-(Br) containing gas such as $BCl_3$, HBr, and $Cl_2$ may cause metal line corrosion. On the other hand, a non-corrosive gas such as fluorocarbon may be used in a plasma etch process but the selectivity of ESL etch against hard mask (HM) and interlevel dielectric (ILD) materials may be low. In various embodiments of the disclosure, the methods are based on a cyclic plasma process comprising an area-selective plasma deposition process and a plasma etch process using one or more fluorine-containing etch gases, and the methods may advantageously provide better etch selectivity of ESL materials. Such an advantage may lead to improving the fine control of critical dimensions of a semiconductor device during fabrication.

In various embodiments, a cyclic plasma process for selectively removing a metal oxide layer is performed as a part of a dual damascene back-end-of-line (BEOL) process in semiconductor fabrication. Although the cyclic plasma process of this disclosure may be described as steps of a dual damascene BEOL process, the cyclic plasma process may be applied in a single damascene BEOL process or other fabrication processes.

Figure 5A:
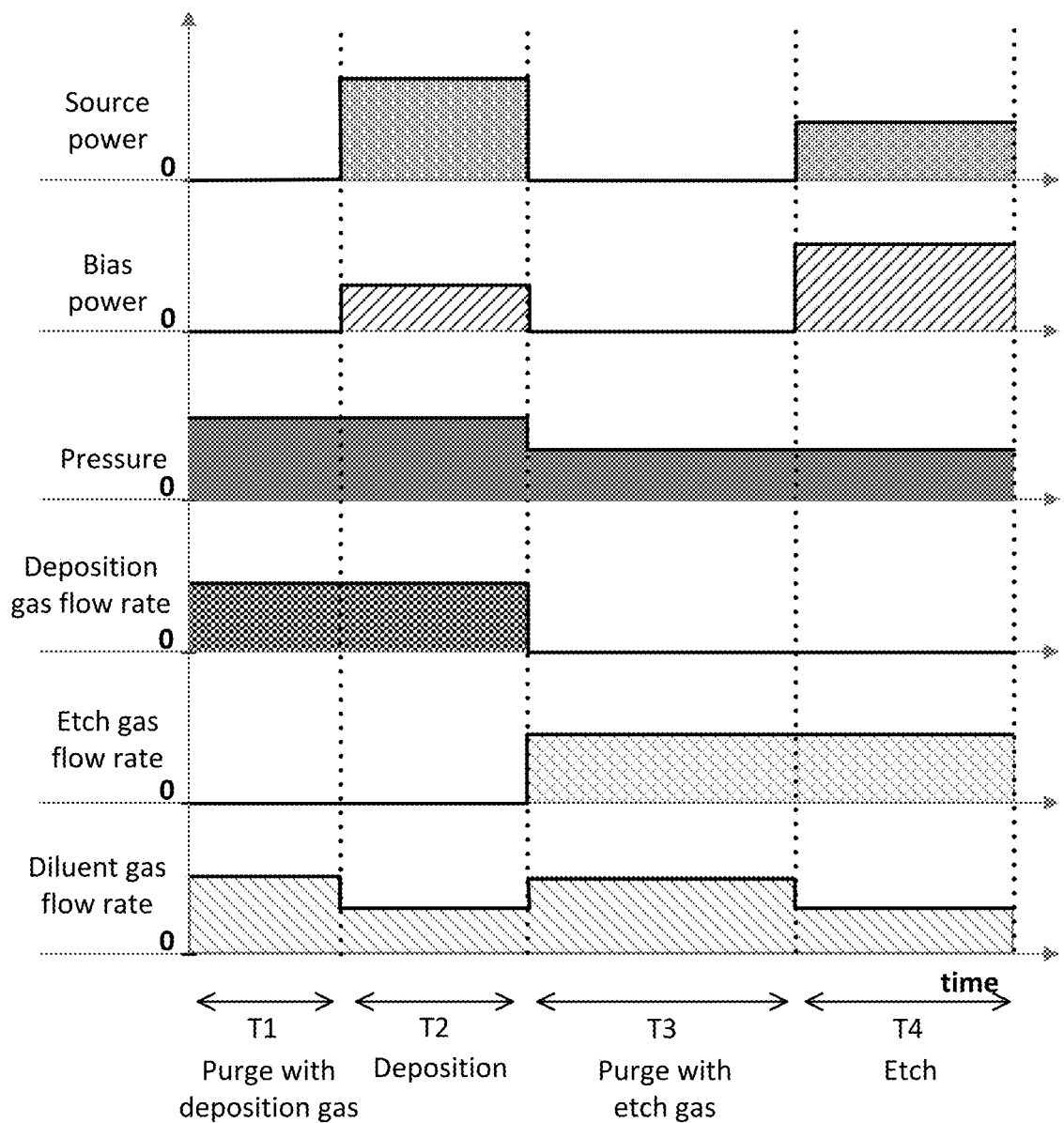
Figure 6:
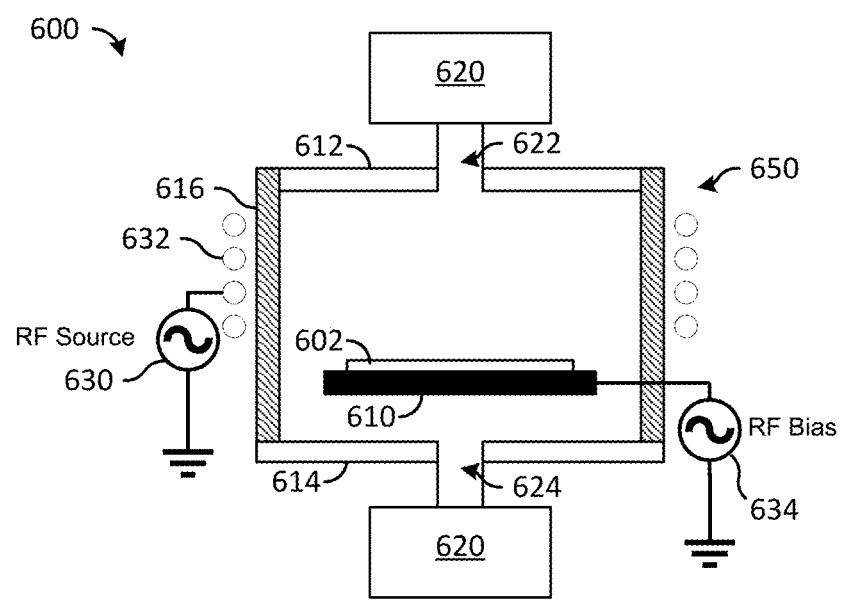
FIG. 6 illustrates a cross-sectional view of a plasma system for performing a time-multiplexed implementation of the cyclic plasma etch process, illustrated in the flow diagram in FIGS. 4A-4D and 5A-5B.
Figure 7A:
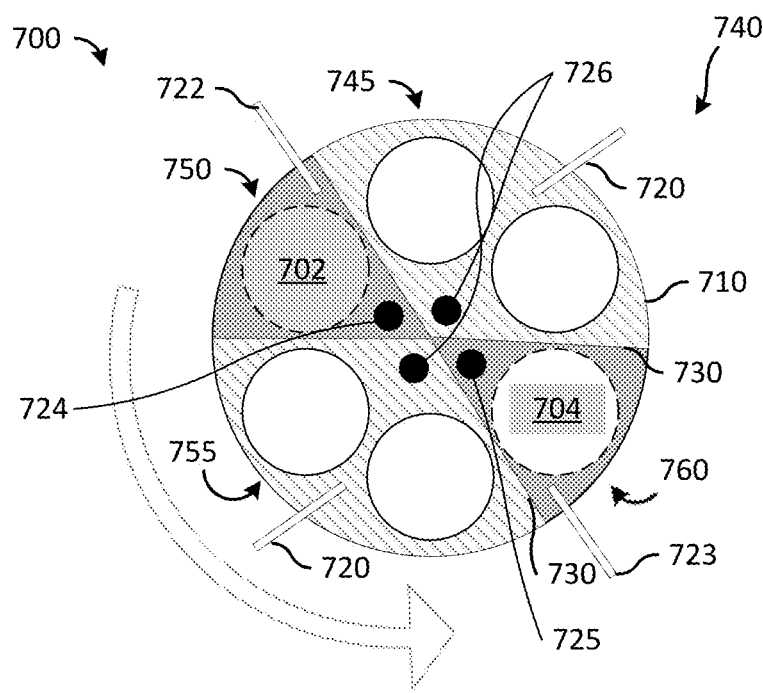
Figure 7B:
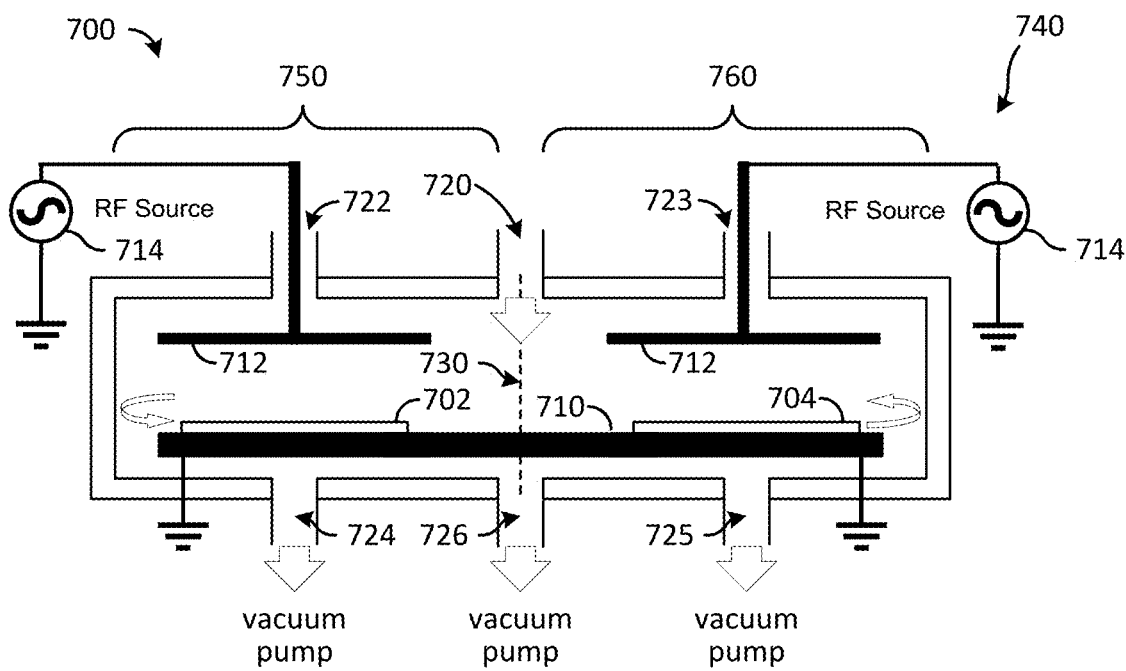

In FIGS. 1A-1M, a dual damascene BEOL process flow (trench-first) that undergoes a cyclic plasma process for ESL removal is first illustrated in accordance with various embodiments. An alternate embodiment dual damascene BEOL process flow (via-first) is illustrated in FIGS. 2A-2E. Further, a cyclic plasma process having two area-selective plasma deposition process steps is illustrated in FIGS. 3A-3C in accordance with other alternate embodiments. Several process flows of a cyclic plasma process are further described referring to FIGS. 4A-4D for different embodiments. Step of the cyclic plasma process may be separated temporally or spatially. To describe the temporal/spatial separation, a timing diagram for one cycle of a time-multiplexed implementation of the cyclic plasma process is illustrated in FIG. 5A and the corresponding process flow chart in FIG. 5B. An example plasma processing system is illustrated in FIG. 6. An alternate plasma processing system and a corresponding method of spatial separation are illustrated in FIGS. 7A and 7B.

FIG. 1A illustrates a cross-sectional view of an incoming substrate 90. In various embodiments, the substrate 90 may be a part of semiconductor device, and may have undergone a number of steps of processing following, for example, a conventional process. The substrate 90 accordingly may comprise layers of semiconductors useful in various microelectronics. For example, the semiconductor structure may comprise the substrate 90 in which various device regions are formed.

In one or more embodiments, the substrate 90 may be a silicon wafer, or a silicon-on-insulator (SOI) wafer. In certain embodiments, the substrate 90 may comprise a silicon germanium wafer, silicon carbide wafer, gallium arsenide wafer, gallium nitride wafer and other compound semiconductors. In other embodiments, the substrate 90 comprises heterogeneous layers such as silicon germanium on silicon, gallium nitride on silicon, silicon carbon on silicon, as well layers of silicon on a silicon or SOI substrate. In various embodiments, the substrate 90 is patterned or embedded in other components of the semiconductor device.

As illustrated in FIG. 1A, the substrate 90 may further comprises a metal layer 100 over the substrate. In some embodiments, there may be one or more layers such as dielectric layers between the substrate 90 and the metal layer 100. In various embodiments, the metal layer 100 may be formed as a part of metal interconnects patterned over the substrate 90. In various embodiments, the metal layer 100 may comprise copper (Cu), aluminum (Al), doped polysilicon, tungsten, titanium nitride, tantalum nitride, ruthenium, and other metals. The metal layer 100 may be formed by deposition using, for example, a physical vapor deposition (PVD).

A dielectric layer may be deposited as a bottom blocking layer 115 over the metal layer 100. In certain embodiments, the bottom blocking layer 115 may comprise a silicon-based dielectric material such as silicon nitride and silicon carbon nitride (SiCN). The bottom blocking layer 115 may be deposited using deposition techniques such as vapor deposition including chemical vapor deposition (CVD), physical vapor deposition (PVD), and atomic layer deposition (ALD), as well as other plasma processes such as plasma enhanced CVD (PECVD), sputtering, and other processes.

Another dielectric layer may be further deposited as an etch stop layer (ESL) 120 over the bottom blocking layer 115. In various embodiments, the ESL 120 may comprise aluminum oxide, aluminum nitride, or zirconium oxide. The ESL 120 may be deposited using deposition techniques such as vapor deposition including chemical vapor deposition (CVD), physical vapor deposition (PVD), and atomic layer deposition (ALD), as well as other plasma processes such as plasma enhanced CVD (PECVD), sputtering, and other processes. In certain embodiments, the thickness of the ESL 120 may be between 2 nm to 5 nm.

Still referring to FIG. 1A, a top blocking layer 125 may be formed over the ESL 120. In certain embodiments, the top blocking layer 125 may comprise a silicon-based dielectric material such as silicon nitride and silicon carbon nitride (SiCN). The top blocking layer 125 may typically be the same material as the bottom blocking layer 115. The top blocking layer 125 may be deposited using deposition techniques such as vapor deposition including chemical vapor deposition (CVD), physical vapor deposition (PVD), and atomic layer deposition (ALD), as well as other plasma processes such as plasma enhanced CVD (PECVD), sputtering, and other processes.

Over the top blocking layer 125, another dielectric layer may be formed as an interlevel dielectric (ILD) layer 130. The ILD layer 130 may comprise a silicon-based dielectric material with a low dielectric constant (i.e., low-k value) such as organosilicate glass (SiCOH), dense SiCOH, porous SiCOH, and other porous dielectric materials. The ILD layer 130 may be deposited using deposition techniques such as vapor deposition including chemical vapor deposition (CVD), physical vapor deposition (PVD), and atomic layer deposition (ALD), as well as other plasma processes such as plasma enhanced CVD (PECVD), sputtering, and other processes.

As further illustrated in FIG. 1A, a first hard mask 140 may be formed over the interlevel dielectric (ILD) layer 130. In certain embodiments, the first hard mask 140 may comprise silicon nitride. In alternate embodiments, the first hard mask 140 may comprise silicon dioxide ($SiO_2$) or titanium nitride. Further, the first hard mask 140 may be a stacked hard mask comprising, for example, two or more layers using two different materials. A first layer of the first hard mask 140 may comprise a metal-based layer such as titanium nitride, titanium, tantalum nitride, tantalum, tungsten based compounds, ruthenium based compounds, or aluminum based compounds, and a second layer of the first hard mask 140 may comprise a dielectric layer such as silicon dioxide, silicon nitride, silicon oxynitride, silicon carbide, amorphous silicon, or polycrystalline silicon. The first hard mask 140 may be deposited using deposition techniques such as vapor deposition including chemical vapor deposition (CVD), physical vapor deposition (PVD), and atomic layer deposition (ALD), as well as other plasma processes such as plasma enhanced CVD (PECVD), sputtering, and other processes.

A first photoresist 150 may be deposited over the first hard mask 140, e.g., using a coating process or a spin-on process. In various embodiments, the first photoresist 150 may comprise a light sensitive organic material, and may be applied over the first hard mask 140 from a solution by, for example, a conventional spin coating technique. As illustrated in FIG. 1A, the first photoresist 150 may be patterned with a pattern using a conventional photolithographic technique. In various embodiments, the pattern of the first photoresist 150 may be used for a first recess formation. In certain embodiments, as illustrated in FIG. 1B, the first pattern may be used for trench formation.

Figure 1B:
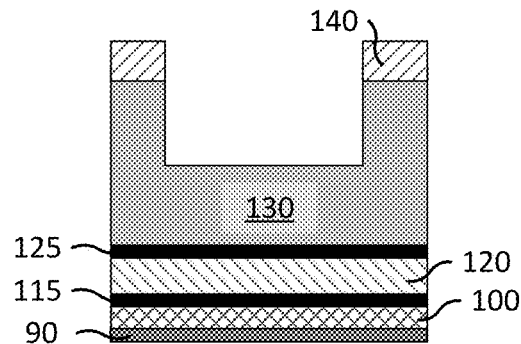

FIG. 1B illustrates the substrate 90 after a trench etch to form a trench feature. The first photoresist 150 in FIG. 1A functions as a mask layer, and the pattern of the first photoresist 150 is transferred. The trench etch anisotropically removes the portion of the first hard mask 140 and the interlevel dielectric (ILD) layer 130 that were not masked by the first photoresist 150. As illustrated in FIG. 1B, the trench etch may be stopped before the top blocking layer 125 will be exposed so that there will be space for via formation in the later steps. An etch stop layer may be used to stop the trench etch but in some embodiments, a timed etch may also be used. In certain embodiments, the trench etch comprises one or more wet etch processes, plasma etch processes, reactive ion etch (RIE) processes, or combinations of these or other etch processes. Any residual first photoresist 150 after the trench etch may be removed from the substrate 90 by, for example, a conventional plasma ashing technique.

Figure 1C:
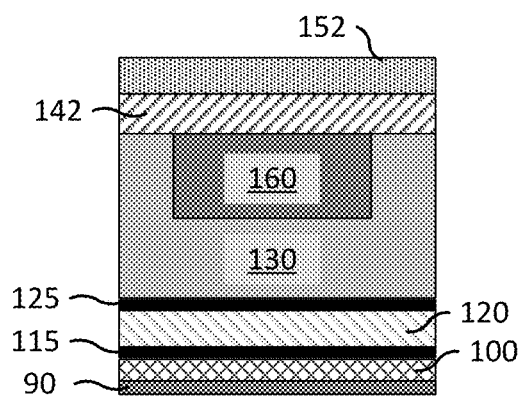

FIG. 1C illustrates the substrate 90 after a trench refill and a deposition of a second hard mask 142 and a second photoresist 152. At the trench refill, after removing any remaining first hard mask 140, a filling material 160 referred to as gap fill materials or organic bottom antireflective coating (BARC) fills the trench feature formed in the previous step. The filling material 160 may be spin applied from solutions of organic solvents. In some embodiments, the filling material 160 may be deposited using other deposition techniques including vapor deposition. A planarization process such as a chemical mechanical planarization process may be used to planar the surface of the filling material 160 to be coplanar with the major surface of the ILD layer 130.

Further, still referring to FIG. 1C, the second hard mask 142 and the second photoresist 152 are applied for a next step of patterning. The second hard mask 142 may be similar to the first hard mask 140 described earlier although in some embodiments it may have different composition. The second hard mask 142 may be deposited using deposition techniques such as vapor deposition including chemical vapor deposition (CVD), physical vapor deposition (PVD), and atomic layer deposition (ALD), as well as other plasma processes such as plasma enhanced CVD (PECVD), sputtering, and other processes. The second photoresist 152 may be similar to the first photoresist 150 described earlier although in some embodiments it may have different composition. The second photoresist 152 be applied over the second hard mask 142 from a solution by, for example, a conventional spin coating technique.

Figure 1D:
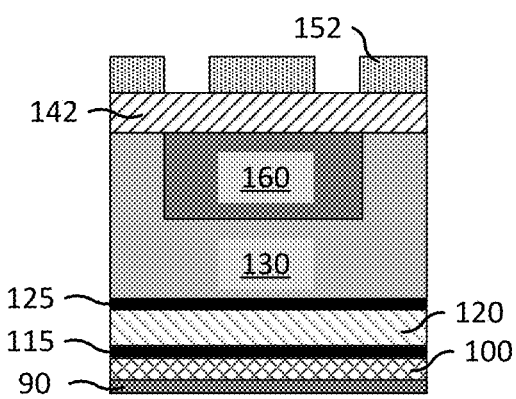

FIG. 1D illustrates the substrate 90 after defining a pattern of the second photoresist 152 by one or more lithography processes. In various embodiments, the pattern of the second photoresist 152 may be used for a second recess formation. In certain embodiments, as illustrated in FIG. 1E, the pattern of the second photoresist 152 may be used for via formation.

Figure 1E:
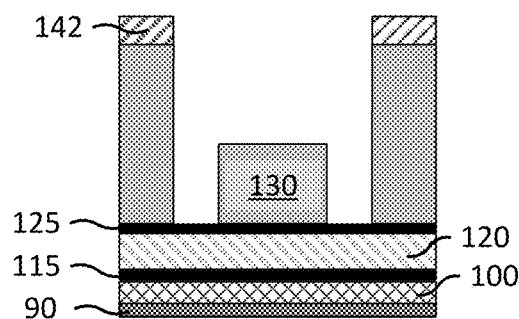

FIG. 1E illustrates the substrate 90 after a via etch, followed by removing the filling material 160. The second photoresist 152 in FIG. 1D functions as a mask layer, and the pattern of the second photoresist 152 is transferred. The via etch anisotropically removes the portion of the second hard mask 142, the filling material 160, and the interlevel dielectric (ILD) layer 130 that were not masked by the second photoresist 152. The remaining second photoresist 152 and the filling material 160 may be removed by, for example, a conventional plasma ashing technique. At this removal step, the portion of the second hard mask 142 isolated over the filling material 160 may also be removed. In certain embodiments, the via etch process comprises one or more wet etch processes, plasma etch processes, reactive ion etch (RIE) processes, or combinations of these or other etch processes.

Figure 1F:
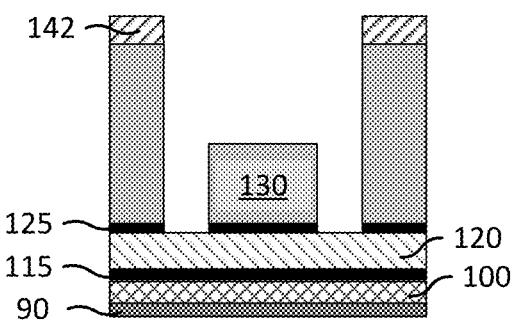

FIG. 1F illustrates the substrate 90 after a removal of the top blocking layer 125 at the bottom of the formed vias. In various embodiments, the removal of the top blocking layer may be performed by an etch process, exposing a portion of the etch stop layer (ESL) 120, prior to the subsequent cyclic plasma process (e.g., FIGS. 1G-1I). In certain embodiments, the etch of the top blocking layer 125 comprises one or more wet etch processes, plasma etch processes, reactive ion etch (RIE) processes, or combinations of these or other etch processes. In certain embodiments, the via etch and the etch of the top blocking layer 125 may be performed as a single etch step. In certain embodiments, the cyclic plasma process described below may be performed in a way that achieves at least a part of the purpose of the via etch or the etch of the top blocking layer 125.

In certain embodiments, before performing the cyclic plasma process, an optional pretreatment may be performed to chemically or physically modify the composition of surface terminal groups of the layers present on the substrate 90 (e.g., the second hard mask 142 and the interlevel dielectric (ILD) layer 130 in FIG. 1F) in order to enhance selectivity of the following cyclic plasma process. For example, the optional pretreatment may be a plasma treatment using a hydrogen-containing reducing agent. In one embodiment, a plasma treatment using molecular hydrogen ($H_2$) may be performed.

Figure 1G:
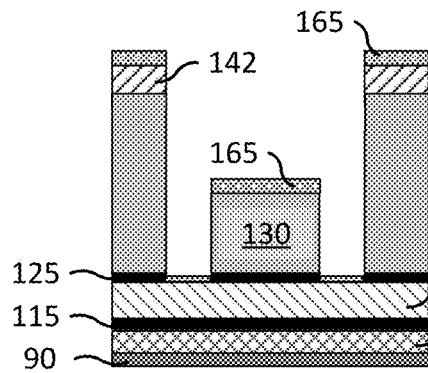

FIG. 1G illustrates the substrate 90, after an area-selective plasma deposition process to form a polymeric film 165. The forming of the polymeric film 165 is a first plasma step of the cyclic plasma process in various embodiments. In various embodiments, by exposing the substrate 90 to the plasma of a deposition gas, the polymeric film 165 may be formed, selectively over the second hard mask 142 and the interlevel dielectric (ILD) layer 130, relative to the ESL 120. In various embodiments, the deposition rate over the second hard mask 142 or the interlevel dielectric (ILD) layer 130 relative to the ESL 120 may be 5:1 to 1000:1 so that little to no polymeric film may be formed over the ESL 120. Thus, the polymeric film 165 is much thicker on the second hard mask 142 or the interlevel dielectric (ILD) layer 130 than the ESL 120.

In various embodiments, the deposition gas comprises a mixture of a polymeric film precursor comprising carbon and a diluent. For example, in various embodiments, the polymeric film precursor is an alkane. In certain embodiments, the deposition gas is a mixture of methane ($CH_4$) and argon (Ar) at any ratio. In some embodiments, the deposition gas may further comprise hydrogen ($H_2$) or nitrogen ($N_2$). In some embodiments, the deposition gas may further comprise ethane, ethylene, and other hydrocarbons.

In one embodiment, the area-selective plasma deposition process may be performed using a gas mixture of $CH_4$ and Ar at a process temperature between 20° C. and 120° C., wherein the polymeric film 165 is preferentially formed over the second hard mask 142 and the interlevel dielectric (ILD) layer 130 comprising silicon-containing materials such as silicon nitride, silicon oxide, and organosilicate glass (Si-COH), relative to the etch stop layer (ESL) 120 comprising aluminum oxide. The silicon oxide may be prepared for example by plasma-enchanced CVD or flowable CVD using tetraethyl orthosilicate (TEOS) as a precursor. In different embodiments, the polymeric film 165 may be preferentially formed over the second hard mask 142 comprising titanium nitride relative to the ESL 120 comprising aluminum oxide.

Figure 1H:
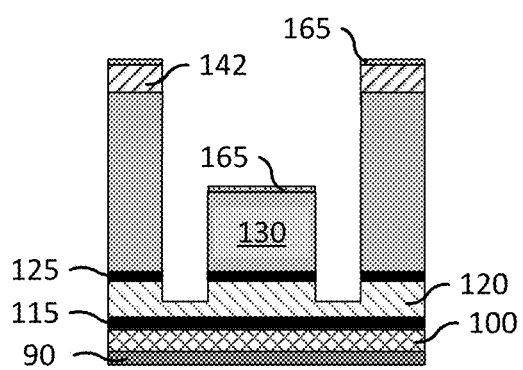

FIG. 1H illustrates the substrate 90 after an etch of the ESL 120 using a gas comprising fluorine, in a second plasma step of the cyclic plasma process. While the exposed portion of the ESL 120 is anisotropically etched, the polymeric film 165, formed by the first plasma step in the previous step above in FIG. 1G (the area-selective plasma deposition process), functions as a protective layer to preserve the second hard mask 142 and the ILD layer 130. The thicker polymeric film 165 formed over the second hard mask 142 or the inter level dielectric (ILD) layer 130 protects the underlying material from the etch enabling even non-selective or less etchants to be used. Any polymeric film 165 if present on the ESL 120 is thinner, and will therefore get etched first and then the exposed ESL 120 will be etched.

In various embodiments, the fluorine-containing etch gas may comprise a gas, which is not corrosive to metals including copper. In various embodiments, the fluorine-containing gas contains no chlorine or bromine and may not induce metal corrosion of metal lines over an extended period of time. This is unlike chlorine or bromine containing gas that may cause corrosion of copper during product lifetime resulting in product failure.

In various embodiments, the fluorine-containing etch gas comprises tetrafluoromethane ($CF_4$), nitrogen trifluoride ($NF_3$), fluoroform ($CHF_3$), difluoromethane ($CH_2F_2$), fluoromethane ($CH_3F$) and combinations thereof. The fluorine-containing etch gas may be selected not to comprise sulfur, which may cause metal corrosion of metal lines, similarly to chlorine or bromine as described above. In certain embodiments, the etch gas further comprises oxygen ($O_2$) at any ratio. In one or more embodiments, the etch gas further comprises 0.1% to 10% by volume of oxygen. The etch gas may further comprise a diluent such as argon (Ar) and nitrogen ($N_2$) at any ratio. In various embodiments, the area-selective plasma deposition (first plasma step) and the subsequent etch plasma process (second plasma step) are repeated in order to achieve a target amount of selective ESL removal. Various embodiments of the cyclic plasma process will further be described with reference to FIGS. 4A-4D.

In certain embodiments, the etch plasma process (second plasma step) preferentially removes the ESL 120 comprising aluminum oxide relative to the polymeric film-protected second hard mask 142 and the interlevel dielectric (ILD) layer 130 comprising silicon-containing materials such as silicon nitride, silicon oxide, and organosilicate glass (Si-COH) using a plasma of tetrafluoromethane ($CF_4$) at a process temperature between 60° C. and 120° C. In different embodiments, the ESL 120 comprising aluminum oxide may be preferentially etched relative to the polymeric film-protected second hard mask 142 comprising titanium nitride.

Figure 1I:
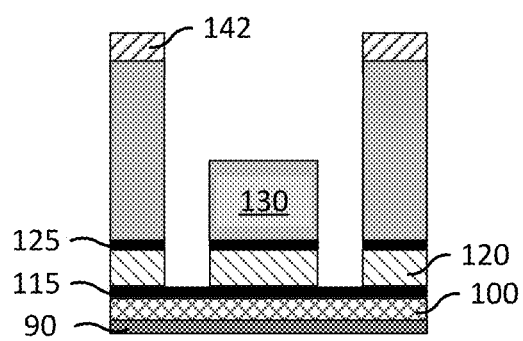

FIG. 1I illustrates the substrate 90 after the completion of the cyclic plasma process. In accordance with various embodiments, the portion of the ESL 120 is removed corresponding to the pattern of the second photoresist 152 defined in FIG. 1D, extending the vias to the bottom blocking layer 115. In the embodiments illustrated in FIG. 1I, process parameters of the cyclic plasma process may be optimized to remove not only the ESL 120 but also the polymeric film 165 completely from the second hard mask 142 and the ILD layer 130.

Figure 1J:
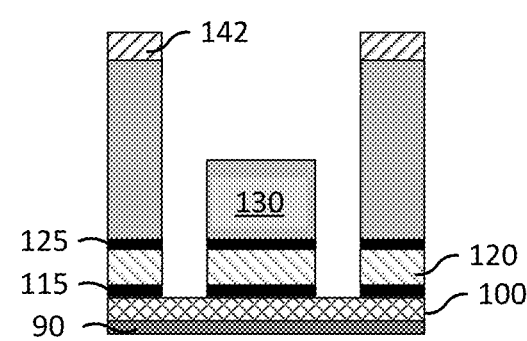

In various embodiments, after the cyclic plasma process, further steps of the dual damascene back-end-of-line (BEOL) process may be performed to form metal interconnects. FIG. 1J illustrates the substrate 90 after an etch to remove a portion of the bottom blocking layer 115, exposing a portion of the metal layer 100 according to the pattern of the vias formed. In certain embodiments, the etch of the bottom blocking layer 115 comprises one or more wet etch processes, plasma etch processes, reactive ion etch (RIE) processes, or combinations of these or other etch processes. In certain embodiments, at least a part of the etch of the bottom blocking layer 115, or any other subsequent steps of the dual damascene BEOL process, may be integrated as a part of the cyclic plasma process described above.

Figure 1K:
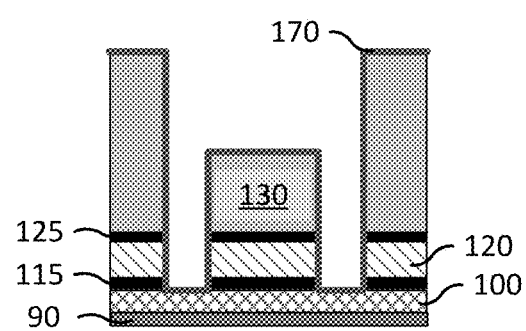

FIG. 1K illustrates the substrate 90 after a deposition of diffusion barrier layer 170. In certain embodiments, the diffusion barrier layer 170 may comprise tantalum, tantalum nitride, titanium, or titanium nitride. The diffusion barrier layer is intended to prevent the metal in the metal layer 100 from diffusing into other components during fabrication. The diffusion barrier layer 170 may be deposited using deposition techniques such as sputtering, vapor deposition including chemical vapor deposition (CVD), physical vapor deposition (PVD), and atomic layer deposition (ALD), as well as other plasma processes such as plasma enhanced CVD (PECVD), and other processes.

Figure 1L:
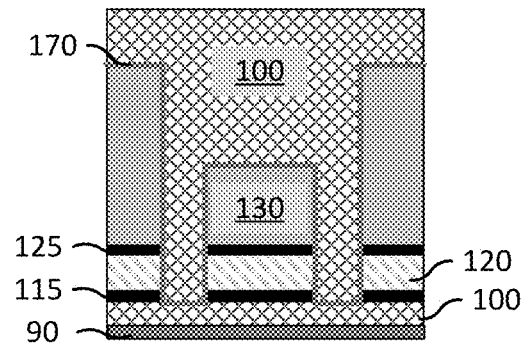

FIG. 1L illustrates the substrate 90 after a metal deposition. The metal deposition may be performed by a seed layer deposition of a metal (e.g., copper) using a sputtering or physical vapor deposition (PVD) technique followed by electroplating. In this step of metal deposition, the vias and trenches are filled with the metal. As illustrated in FIG. 1L, in various embodiments, the same metal as the metal layer 100 may usually be used for the metal deposition.

Figure 1M:
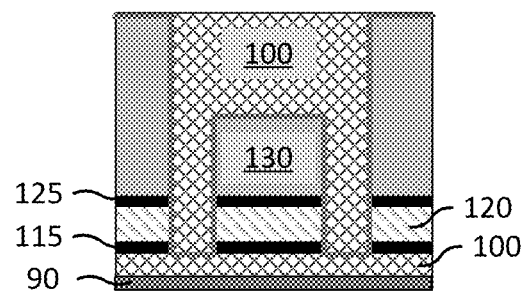

Lastly, FIG. 1M illustrates the substrate 90 after a planarization, where an excess metal is removed by, for example, a chemical mechanical planarization (CMP) method.

In the example embodiment illustrated in FIGS. 1A-1M, the trench etch (FIG. 1B) is performed prior to the via etch (FIG. 1E). This sequence is called trench-first. In other embodiments, however, a via etch may be performed prior to a trench etch (via-first) as illustrated in FIGS. 2A-2E as below.

Figures 2A, 2B:
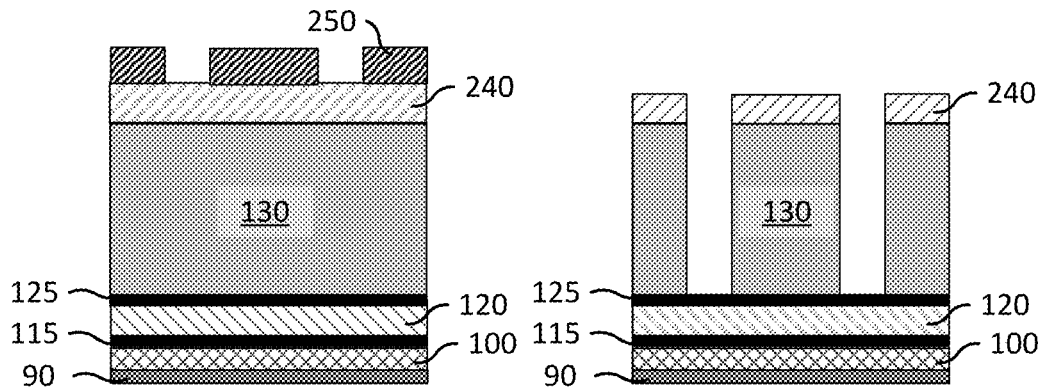
Figures 3A, 3B:
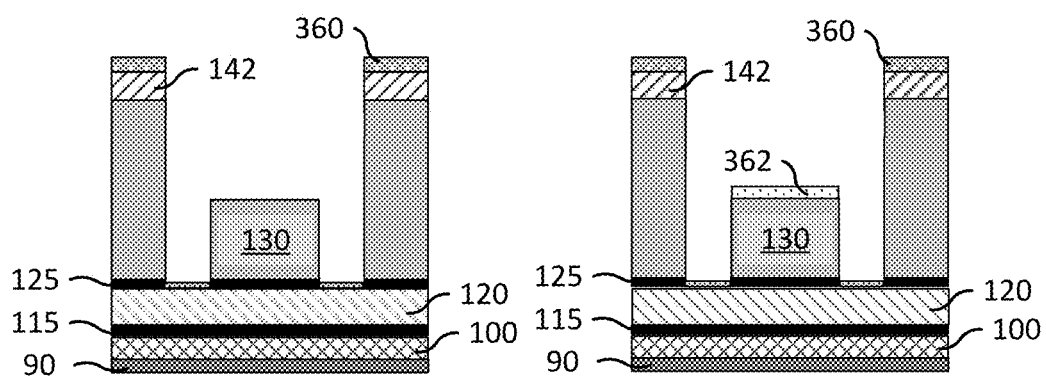
Figure 3C:
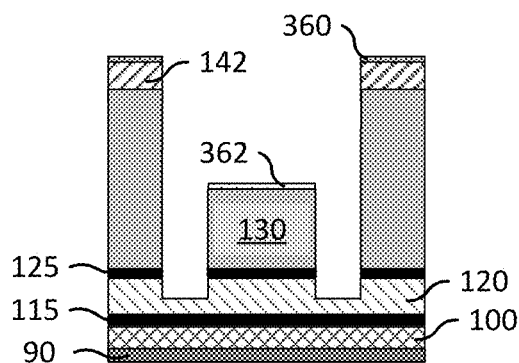

In FIG. 2A, the incoming substrate 90 has a structure similar to the previous (trench-first) embodiments described above, with a layer stack comprising the metal layer 100, the bottom blocking layer 115, the etch stop layer (ESL) 120, the top blocking layer 125, the interlevel dielectric (ILD) layer 130. Over the ILD layer 130, a first hard mask 240 is formed. A first photoresist 250 may be formed over the first hard mask 240 with a pattern for a via etch, similar to the pattern in FIG. 1D. The first hard mask 240 and the first photoresist 250 may be similar to the first hard mask 140 and the first photoresist 150 in FIG. 1A, respectively, although in some embodiments, they may have different compositions.

FIG. 2B illustrates the substrate 90 after a via etch. The first photoresist 250 in FIG. 2A functions as a mask layer, and the pattern of the first photoresist 250 is transferred. As previously described with previous embodiments, the via etch may be performed using appropriate etch processes to anisotropically remove the portion of the first hard mask 240 and the interlevel dielectric (ILD) layer 130 that were not masked by the first photoresist 250, and expose the top blocking layer 125 at the bottom of the formed vias.

Figures 2C, 2D:
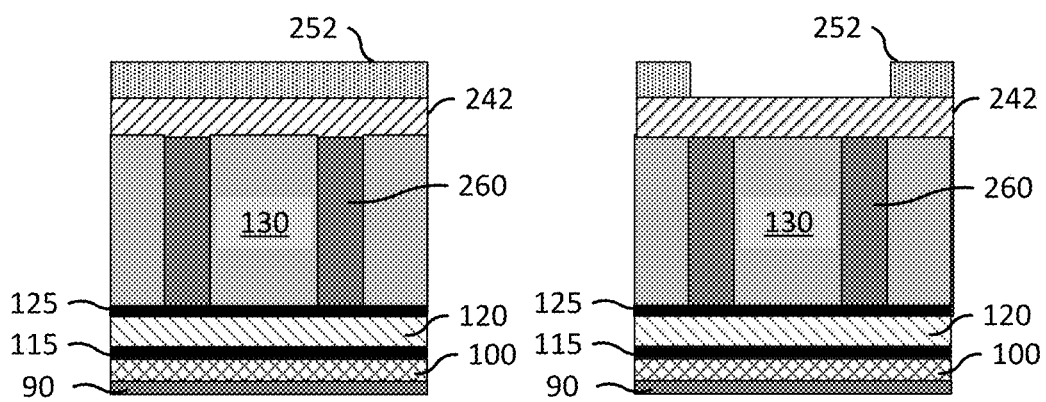

FIG. 2C illustrates the substrate 90 after a via refill and a deposition of a second hard mask 242 and a second photoresist 252. At the via refill, after removing any remaining first hard mask 240, a filling material 260 fills the via feature formed in the previous step. The filling material 260 may be similar to the filling material 16o, although in some embodiments, it may have a different composition. The filling material 260 may be spin applied from solutions of organic solvents. In some embodiments, the filling material 260 may be deposited using other deposition techniques including vapor deposition. A planarization process such as a chemical mechanical planarization process may be used to planar the surface of the filling material 260 to be coplanar with the major surface of the ILD layer 130.

Further in FIG. 2C, similarly to FIG. 1C, the second hard mask 242 and the second photoresist 252 are formed over the ILD layer 130 and the filling material 260. The second hard mask 242 and the second photoresist 252 may be similar to the first hard mask 240 and the first photoresist 250, respectively, although they may have different compositions. The second hard mask 242 may be deposited using appropriate deposition techniques similarly to the second hard mask 142 in FIG. 1C. The second photoresist 252 may be applied over the second hard mask 242 from a solution by, for example, a conventional spin coating technique.

FIG. 2D illustrates the substrate 90 after defining a pattern of the second photoresist 252 by one or more lithography processes. The pattern of the second photoresist 252 may be used for trench formation.

Figure 2E:
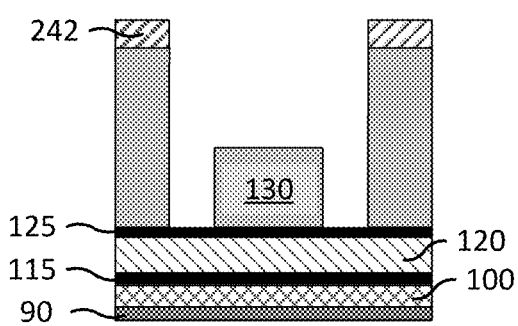

FIG. 2E illustrates the substrate 90 after a trench etch. The second photoresist 252 patterned in FIG. 2D functions as a mask layer, and the pattern of the second photoresist 252 is transferred. As previously described with previous embodiments, the trench etch may be performed using appropriate etch processes to anisotropically remove the portion of the second hard mask 242, the filling material 260, and the interlevel dielectric (ILD) layer 130 that were not masked by the second photoresist 252. As illustrated in FIG. 2E, the trench etch may be performed to completely remove the filling material 260 to expose the top blocking layer at the bottom of the vias, but stopped before the portion of the ILD layer 130 that was not masked by the second photoresist 252 will be completely removed. An etch stop layer may be used to stop the trench etch but in some embodiments, a timed etch may also be used. Any residual second photoresist 252 may be removed by, for example, a conventional plasma ashing technique. At this stage, the substrate 90 has a structure with trench and via features, similar to the structure illustrated in FIG. 1E formed by the trench-first embodiment.

Subsequently, a removal of the top blocking layer 125, a cyclic plasma process, and following processes may be performed similarly to the previous embodiments (e.g., FIG. 1F, FIGS. 1G-1I, and FIGS. 1J-1M, respectively).

Although the previous embodiments are described as a part of a dual damascene back-end-of-line (BEOL) process, the cyclic plasma process in this disclosure is not limited to the dual damascene BEOL process, and may be applied to other fabrication processes to selectively remove a certain material (e.g., aluminum oxide) with one or more protective layers selectively formed over other materials (e.g., silicon-containing materials). In one embodiment, the cyclic plasma process may be applied in a single damascene BEOL process. In one cycle of the single damascene BEOL process, only one recess such as a trench or a via may be formed instead of two recesses in the dual damascene BEOL process. For example, the cyclic plasma etch may be performed after a via formation (e.g., FIG. 2B).

In various embodiments, the cyclic plasma process may comprise two separate area-selective plasma deposition process steps. With the embodiment method, selective etch of a target material from a surface comprising more than two materials may be improved. The formation of trench and via prior to the cyclic plasma process may be performed by a trench-first method (e.g., FIGS. 1A-1E) or a via-first method (e.g., FIGS. 2A-2E), resulting in the same structure as illustrated in FIG. 1F. The subsequent steps of the cyclic plasma process in accordance with these embodiments are illustrated in FIGS. 3A-3C.

In FIG. 3A, the substrate 90 after a first area-selective plasma deposition process using a first deposition gas (first plasma step) is illustrated. The first deposition gas may be similar to the deposition gas as previously described with reference to FIG. 1G. As illustrated, a first polymeric film 360 may be preferentially formed over the second hard mask 142 relative to the interlevel dielectric (ILD) layer 130 and the etch stop layer (ESL) 120. The first polymeric film 360 may be similar in composition to the polymeric film 165 described above and may be formed similarly. At this stage, for example, the first deposition gas composition and other process parameters may be selected to achieve a high deposition rate and/or selectivity with respect to the second hard mask 142.

Next, in FIG. 3B, the substrate 90 after a second area-selective plasma deposition process using a second deposition gas (second plasma step) is illustrated. A second polymeric film 362 different in composition from the first polymeric film 360 may be preferentially formed over the ILD layer 130 relative to the second hard mask 142 and the ESL 120. The first polymeric film 360, the second polymeric film 362, or both may be similar in composition to the polymeric film 165. In one embodiment, the first and second polymeric film 360 and 362 may be the same in composition, but formed at different rates by selecting different process parameters for the first and second plasma steps. The second deposition gas may be similar to the deposition gas as previously described with reference to FIG. 1G. For example, the second deposition gas comprises a mixture of a second polymeric film precursor comprising carbon and a diluent. In certain embodiments, the second polymeric film precursor is an alkane. In certain embodiments, the deposition gas is a mixture of methane ($CH_4$) and argon (Ar) at any ratio. In some embodiments, the deposition gas may further comprise hydrogen ($H_2$) or nitrogen ($N_2$). The second deposition gas may or may not be the same as the first deposition gas for the first area-selective plasma deposition process. The second deposition gas composition and other process parameters may be selected to achieve a high deposition rate and/or selectivity with respect to the interlevel dielectric (ILD) layer 130.

In one embodiment, the process parameters of the first plasma step may be optimized for the formation of the first polymeric film 360 over the hard mask comprising silicon, while the process parameters of the second plasma step may be optimized for the formation of the second polymeric film 362 over the ILD layer 130 comprising a low-k dielectric such as SiCOH, with both conditions being still selective relative to the etch stop layer (ESL) 120 comprising aluminum oxide.

FIG. 3C illustrates the substrate 90 after an etch of the ESL 120 using a gas comprising fluorine, in a third plasma step of the cyclic plasma process. As previously described in FIG. 1H, the exposed portion of the ESL 120 is anisotropically etched. The first and second polymeric films 360 and 362 formed by the first and second area-selective plasma deposition process steps above (first and second plasma steps) function as protective layers to preserve respectively the second hard mask 142 and the ILD layer 130.

Although the embodiments described above (e.g., FIGS. 3A-3C) comprise two area-selective plasma deposition process steps, in alternate embodiments, a cyclic plasma process may comprise any number of area-selective plasma deposition process steps and one or more etch processes.

Figure 4A:
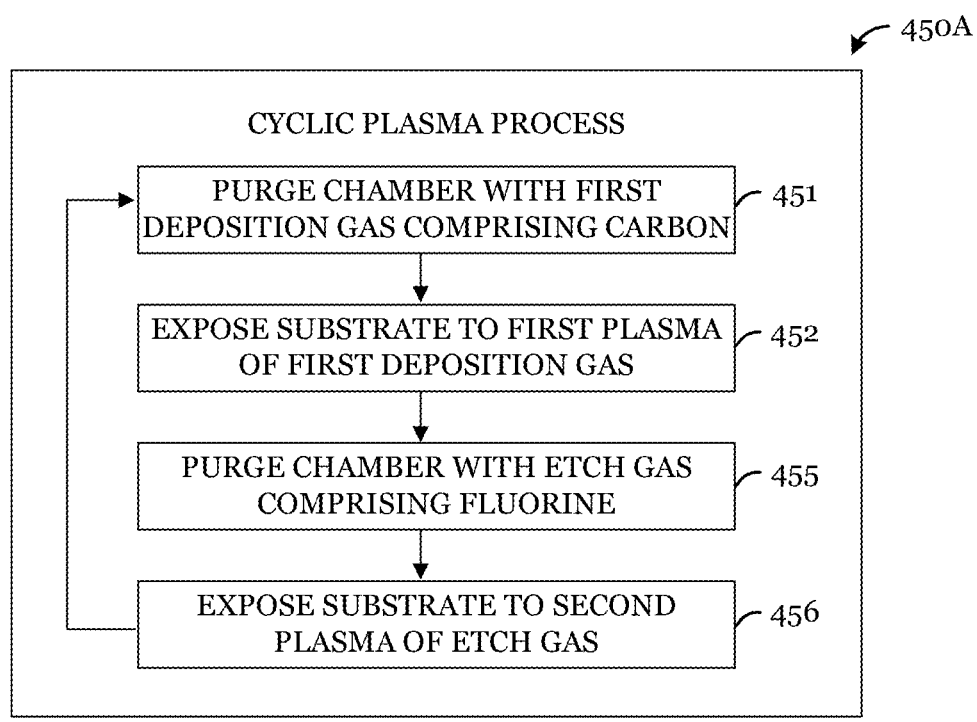

In the following, FIGS. 4A-4D illustrate process flow charts of a cyclic plasma process corresponding to embodiments previously described, where in FIG. 4A corresponds to FIGS. 1G-1I, FIG. 4B to FIGS. 1A-1M, FIG. 4C to FIGS. 2A-2E and 1F-1M, and FIG. 4D to FIGS. 3A-3C, respectively.

In various embodiments, all steps of the cyclic plasma process, e.g., corresponding to FIGS. 1G-1I, may be performed within a plasma processing tool.

In FIG. 4A, in accordance with various embodiments, a process flow of the cyclic plasma process is illustrated. The cyclic plasma process (block 450A) comprises four main steps: purging a plasma processing chamber of the plasma processing tool with a deposition gas comprising carbon (block 451), exposing the substrate to a plasma generated from the deposition gas (block 452) (e.g., FIG. 1G), purging the plasma processing chamber with an etch gas comprising fluorine (block 455), and exposing the substrate to a plasma of the etch gas (block 456) (e.g., FIG. 1H). Each step of the cyclic plasma process may be separated temporally or spatially. In certain embodiments, the cyclic plasma process may be performed in a single section of a plasma processing chamber by time-multiplexed processing, illustrated in detail in FIGS. 5 and 6. In other embodiments, the cyclic plasma process may be performed in segregated sections of the plasma processing chamber, and the substrate may be transported from one section to another for a transition to a next step, illustrated with reference to FIGS. 7A and 7B.

As the first step of the cyclic plasma process, in block 451, the plasma processing chamber is purged with a deposition gas comprising carbon such as methane ($CH_4$) and the substrate temperature may be brought to an equilibrium at a process temperature. In various embodiments, the substrate temperature may be increased, for example, by a heater and cooled by water cooling or liquid helium cooling, controlled by a temperature controller.

Second, in block 452, a first plasma step of the cyclic plasma process (area-selective plasma deposition) is performed by a plasma deposition tool such as plasma-enhanced chemical vapor deposition (PECVD) tool (e.g., FIG. 1G). A plasma of the deposition gas is generated in the plasma processing chamber by providing a plasma source energy from one or more plasma power sources, and the substrate is exposed to the plasma of the deposition gas. A precursor species for the polymeric film 165 can be energized by the plasma to form radicals. These radicals may be adsorbed on the surface and randomly react with each other in a plasma polymerization process to form the polymeric film 165 (e.g., FIG. 1G). The difference in adsorption between different materials can lead to different rates of plasma polymerization and thereby different film growth rates. Therefore, the process parameters, such as source power, bias power, gas flow rate, process pressure, process temperature, process time, and gas composition, can be optimized to realize the area selective formation of polymeric film.

Next, in block 235, after the first plasma step is terminated by turning off the plasma source power, the plasma processing chamber is purged with an etch gas comprising fluorine. In various embodiments, the substrate temperature may be kept at the same as the first plasma step, or may be brought to an equilibrium at another process temperature. In various embodiments, the substrate temperature may be increased, for example, by a heater and cooled by water cooling or liquid helium cooling, controlled by a temperature controller.

A second plasma step, in block 456, is performed to etch metal oxide (e.g., the ESL 120 in FIG. 1H). As illustrated in FIG. 1H, the polymeric film 165 may also be partially or completely removed during this step. A plasma of the etch gas is generated in the plasma processing chamber and the substrate is exposed to the plasma of the etch gas. In certain embodiments, the polymeric film 165 and the ESL 120 comprising aluminum oxide are anisotropically etched while preserving other materials (e.g., the second hard mask 142 and the interlevel dielectric (ILD) layer 130 in FIG. 1H).

With some conventional methods, a plasma etch using a non-corrosive gas tends to result in a non-selective etch. Typical condition for removing metal oxide materials such as aluminum oxide often damage other materials such as silicon-containing materials that may be used as a hard mask and an interlevel dielectric (ILD) layer. However, with the embodiment methods in this disclosure, such damage may advantageously be minimized or completely eliminated owing to the presence of the polymeric film formed over such materials during the area-selective deposition in the first plasma step. The process parameters, such as source power, bias power, gas flow rate, process pressure, process temperature, process time, and gas composition, can be optimized to effectively etch the target metal oxide materials, while the removal of the polymeric film may also be accomplished.

In certain embodiments, prior to any of the purge steps (e.g., blocks 451 and 455), the plasma processing chamber may be evacuated to vacuum. Furthermore, in some embodiments, one or more additional treatment steps may be inserted between steps. The additional treatment may be a thermal treatment under vacuum, a wet process, a plasma treatment similar to the pretreatment (block 445), or other processes.

In various embodiments, this cycle of the four steps (blocks 451, 452, 455, and 456) may be repeated to achieve a desired process performance. A cycle may start at any step of the four steps.

Figure 4B:
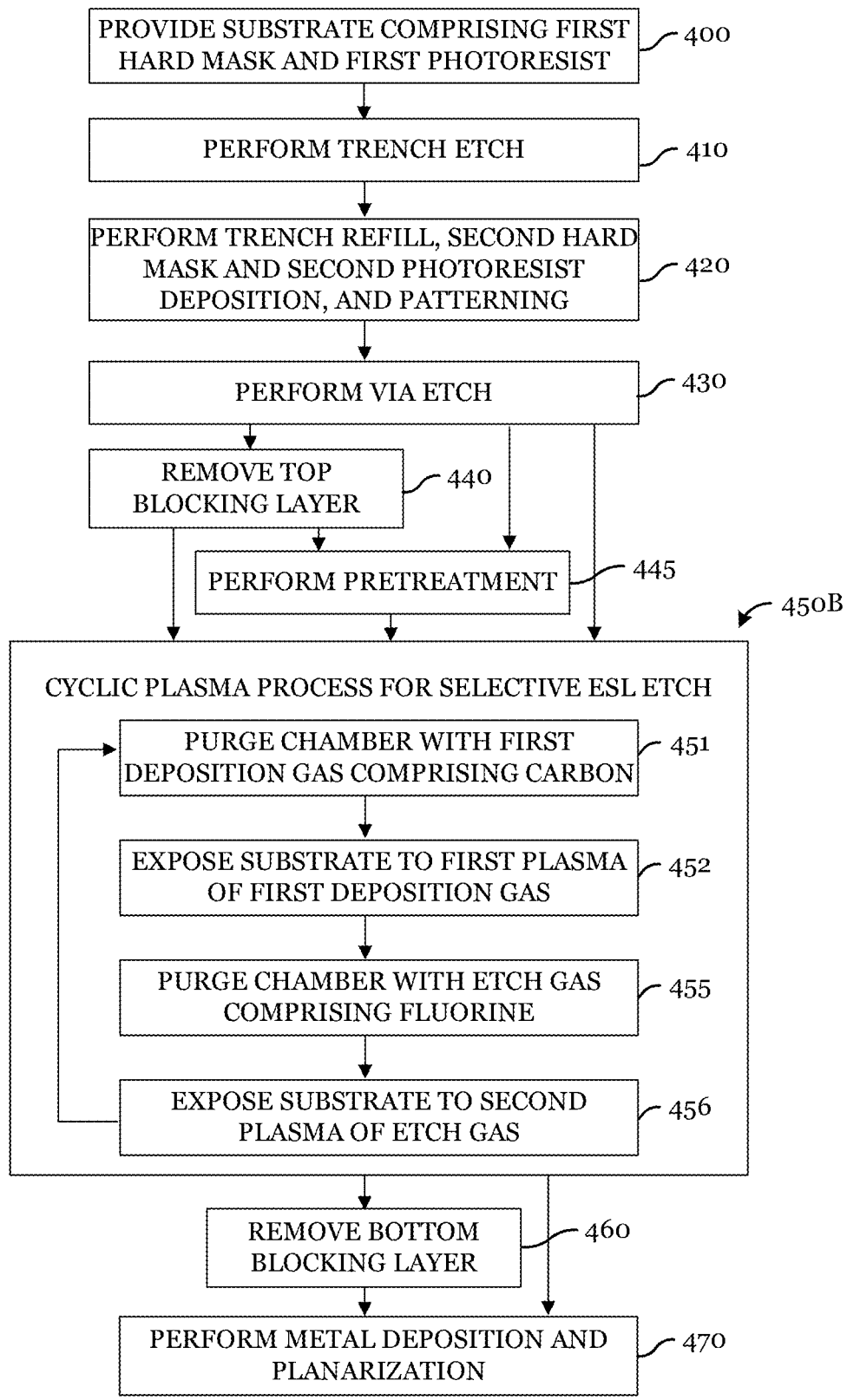

In FIG. 4B, in accordance with certain embodiments, the cyclic plasma process may be used to selectively remove an etch stop layer (ESL) from a substrate as a part of a dual damascene back-end-of-line (BEOL) process with a trench-first method (e.g., FIGS. 1A-1M).

The substrate may have undergone various fabrication steps and have a layer stack comprising the first hard mask 140 and the first photoresist 150 (block 400) (e.g., FIG. 1A). First, a trench etch (block 410) (e.g., FIG. 1B) is performed to form a trench feature as previously described. Next, a trench refill, a deposition of the second hard mask 142 and the second photoresist 152, a patterning of the second photoresist 152 are performed (block 420) (e.g., FIGS. 1C and 1D). Subsequently, a via etch is performed (block 430) (e.g., FIG. 1E). Next, the top blocking layer 125 may optionally be removed (block 440) (e.g., FIG. 1F). In some embodiments, this step of removing the top blocking layer 125 may be integrated into the subsequent cyclic plasma process (block 450B) (e.g., FIGS. 1G-1I). Further, an optional pretreatment (block 445) may be performed to chemically or physically modify the composition of surface terminal groups of the layers present on the substrate 90 (e.g., the second hard mask 142 and the interlevel dielectric (ILD) layer 130 in FIG. 1F) in order to enhance selectivity of the following cyclic plasma process. The cyclic plasma process (block 450B) (e.g., FIGS. 1G-1I) may be performed next as previously described referring to block 450A in FIG. 4A.

Still referring to FIG. 4B, after the completion of the cyclic plasma process (block 450B), the bottom blocking layer 115 may optionally be removed (block 460) (e.g., FIG. 1J). In some embodiments, this step of removing the bottom blocking layer 115 may be integrated into the previous cyclic plasma process (block 450B) (e.g., FIGS. 1G-1I). Subsequently, a deposition of diffusion barrier layer 170, a metal deposition, and a planarization are performed to complete a cycle of the formation of metal interconnects (block 470) (e.g., FIGS. 1K-1M).

Figure 4C:
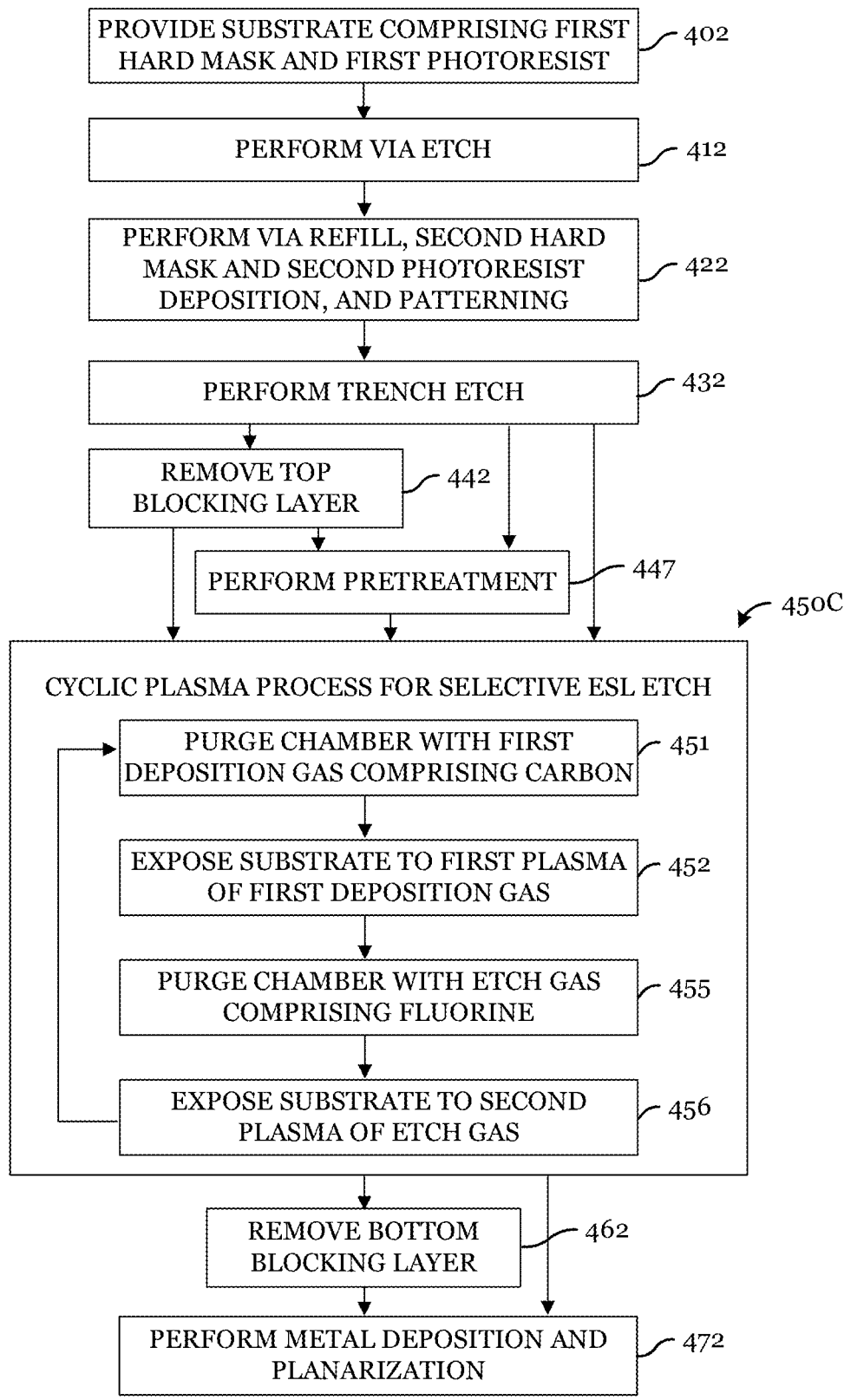

FIG. 4C illustrates an example process flow chart of a dual damascene back-end-of-line (BEOL) process with a via-first method in accordance with alternate embodiments (e.g., FIGS. 2A-2E and 1F-1M).

Similarly to the previous embodiments with a trench-first method, the substrate may have undergone various fabrication steps and have a layer stack comprising the first hard mask 240 and the first photoresist 250 (block 402) (e.g., FIG. 2A). First, a via etch (block 402) (e.g., FIG. 2B) is performed to form a via feature as previously described. Next, a via refill, a deposition of the second hard mask 242 and the second photoresist 252, a patterning of the second photoresist 252 are performed (block 422) (e.g., FIGS. 2C and 2D). A trench etch is then performed (block 432) (e.g., FIG. 2E). Subsequent processes may be similar to the process flow of the trench-first embodiments previously described (e.g., FIGS. 1F-1M and FIG. 4B). The top blocking layer 125 may optionally be removed (block 442) (e.g., FIG. 1F), although in some embodiments, this step of removing the top blocking layer 125 may be integrated into the subsequent cyclic plasma process (block 450B) (e.g., FIGS. 1G-1I). Further, an optional pretreatment (block 447) may be performed to chemically or physically modify the composition of surface terminal groups of the layers present on the substrate 90 (e.g., the second hard mask 142 and the interlevel dielectric (ILD) layer 130 in FIG. 1F) in order to enhance selectivity of the following cyclic plasma process. The cyclic plasma process (block 450C) and subsequent processes may be similar to the previous embodiments described above (e.g., blocks 450B, 460, and 470 in FIG. 4B). After the completion of the cyclic plasma process (block 450C), the bottom blocking layer 115 may optionally be removed (block 462) (e.g., FIG. 1J), although in some embodiments, this step of removing the bottom blocking layer 115 may be integrated into the previous cyclic plasma process (block 450C) (e.g., FIGS. 1G-1I). Lastly, a deposition of diffusion barrier layer 170, a metal deposition, and a planarization are performed (block 472) (e.g., FIGS. 1K-1M).

Figure 4D:
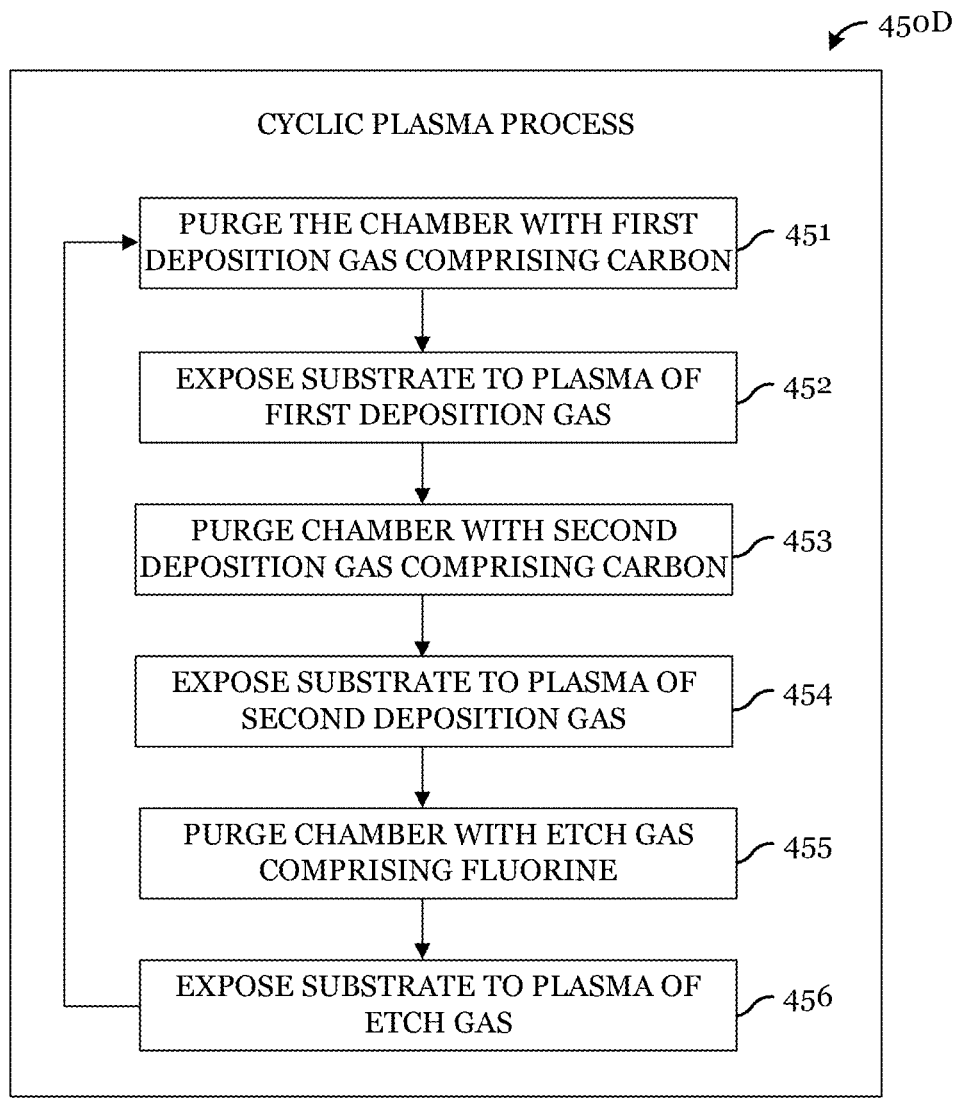

FIG. 4D illustrates an example process flow chart of a cyclic plasma process comprising two area-selective plasma deposition process steps and one etch process in accordance with different embodiments (e.g., FIGS. 3A-3C). As previously described, in certain embodiments, a cyclic plasma process comprising two area-selective plasma deposition process steps may be used to enable two optimized conditions for plasma deposition of two polymeric films over two different materials relative to a target etch material.

In these embodiments, a cyclic plasma process may comprise six steps. In addition to the four steps described previously (e.g., blocks 451, 452, 455, and 456 in FIGS. 4A-4C), a purge step (block 453) with a second deposition gas and an area-selective plasma deposition process with the second deposition gas (block 454) are inserted after the first area-selective plasma deposition step (block 452).

In this disclosure, the details of a cyclic plasma process and alternate embodiments are described with the focus on the main four steps: two purge steps and an area-selective plasma deposition and an etch (e.g., block 450A in FIG. 4A). However, it is envisioned that such details may be applicable in a cyclic plasma process comprising any number of plasma deposition and etch processes (e.g., block 450D for an example with two deposition process steps and one etch process).

FIG. 5A illustrates a timing diagram for four steps in one cycle of a time-multiplexed implementation of the cyclic plasma process, for example as illustrated in the flow diagram in FIG. 4A. The six horizontal axes in FIG. 5A represent progression in time. The four time intervals, T1, T2, T3, and T4, for the four steps of one cycle of the cyclic plasma etch process 230 are schematically shown by the four double arrows adjacent to one time axis. With reference to FIG. 4A, T1, T2, T3, and T4 respectively correspond to the purge with the deposition gas (block 451), the area-selective plasma deposition process (block 452), the purge with the etch gas (block 455), and the plasma etch (block 456). Four vertical dotted lines intersecting the time axes demarcate the non-overlapping time intervals, T1, T2, T3, and T4. In certain embodiments, T1 may be about 5 to about 60 s, T2 may be about 1 to about 5 s, T3 may be about 5 to about 60 s, and T4 may be about 1 to 5 s. The duration of time intervals T1, T2, T3, and T4 may be unequal, in accordance with the respective process recipe. The six time axes are used to schematically display plots of six process parameters vs. time for one cycle of the plurality of cycles of the example cyclic plasma etch process 450A as illustrated in FIG. 4A. The six process parameters plotted in FIG. 5A are the source power, the bias power, the process pressure, the gas flow rate of deposition gas, the gas flow rate of etch gas, and the gas flow rate of diluent gas.

Although not specifically described in FIG. 5A, any other process parameters such as temperature may be controlled independently at each step of the cyclic plasma process in accordance with the respective process recipe. In certain embodiments, the time intervals T1 and T3 may be adjusted for stabilizing the process temperatures for T2 and T4, respectively.

In various embodiments, the substrate is kept at a temperature between 5° C. and 120° C. In some embodiments, temperature may be changed at each step of the cyclic plasma process, and purge steps are used to stabilize the system prior to generating a plasma. In alternate embodiments, temperature may be programmed to be ramped or cooled during the plasma steps, that is, the time intervals, T2 and T4.

During the time interval, T1, illustrated in FIG. 5A, the deposition gas is introduced to purge the plasma processing chamber while the source power and the bias power are off. In certain embodiments, the diluent gas is also used optionally. In various embodiments, total gas flow may be between 20 to 1000 sccm. Process pressure may be between 5 to 100 mTorr. In some embodiments, $CH_4$/Ar gas flows are 30/150 sccm and the process pressure is 10 mTorr.

Switching from the time interval, T1, to the next time interval, T2, for area-selective plasma deposition, is performed by turning on the source power and the bias power. In this step, a radical-rich conditions are desired for the polymeric film formation. To achieve the radical-rich environment, a sufficiently high source power may be applied. In various embodiments, the source power may be between 50 W and 1000 W and the bias power may be between 0 W and 200 W. Total gas flow may be between 20 to 1000 sccm. Process pressure may be between 5 to 100 mTorr. In some embodiments, the source power is 500 W and the bias power is 100 W. $CH_4$/Ar gas flows are 30/150 sccm. The process pressure is 10 mTorr. In certain embodiments, the gas flow rate of the diluent gas may be changed between T1 and T2.

Next, the time interval, T3, is initiated by turning off the source power and bias power. Simultaneously, the gas flow is also switched from the deposition gas to the etch gas to purge the plasma processing chamber. The gas flow rate is selected independently from the conditions in T1 and T2. In various embodiments, total gas flow may be between 20 to 1000 sccm. Process pressure may be between 5 to 100 mTorr. In some embodiments, $CF_4$/$CHF_3$/Ar gas flows are 60/60/520 sccm and the process pressure is 10 mTorr.

After the completion of purging the plasma processing chamber with the etch gas, the time interval, T4, is initiated by turning on the source power and bias power to discharge the etch gas to generate a plasma. In the etch step, it is important to achieve a condition for anisotropic etching so that the materials at the bottom of vias are sufficiently etched while causing little to no damage on the sidewalls. For the anisotropic etching conditions, a relatively high bias power is desired compared with the deposition step. In various embodiments, the source power may be between 10 and 1000 W and the bias power may be between 50 and 500 W. Total gas flow may be between 20 to 1000 sccm. Process pressure may be between 5 to 100 mTorr. In some embodiments, the source power is 50 W and the bias power is 600 W. $CF_4$/$CHF_3$/Ar gas flows are 60/60/520 sccm and the process pressure is 10 mTorr.

After the time interval, T4, a next cycle of four time intervals may be performed. The cycle may be repeated any number of times to achieve a desired process performance. Although FIG. 5A illustrates a single set of conditions for one cycle of the cyclic plasma process, in various embodiments, each cycle may have conditions of process parameters different from the first cycle, the process parameters comprising any of the time intervals (T1, T2, T3, and T4), gas flow rates, gas compositions, process pressure, process temperature, source power, and bias power.

Further, it should be noted that the plots in FIG. 5A are for illustrative purposes only. For example, the plots show the process parameters to be changing as step functions, although it is understood that instantaneous changes of the process parameters are not achievable and that there are finite response times to be accounted for before the physical parameters stabilize. In addition, as described above, one or more additional treatment steps such as evacuation, a thermal treatment under vacuum, a wet process, a plasma treatment, and so on, may be inserted after any of the time intervals (T1, T2, T3, and T4).

Figure 5B:
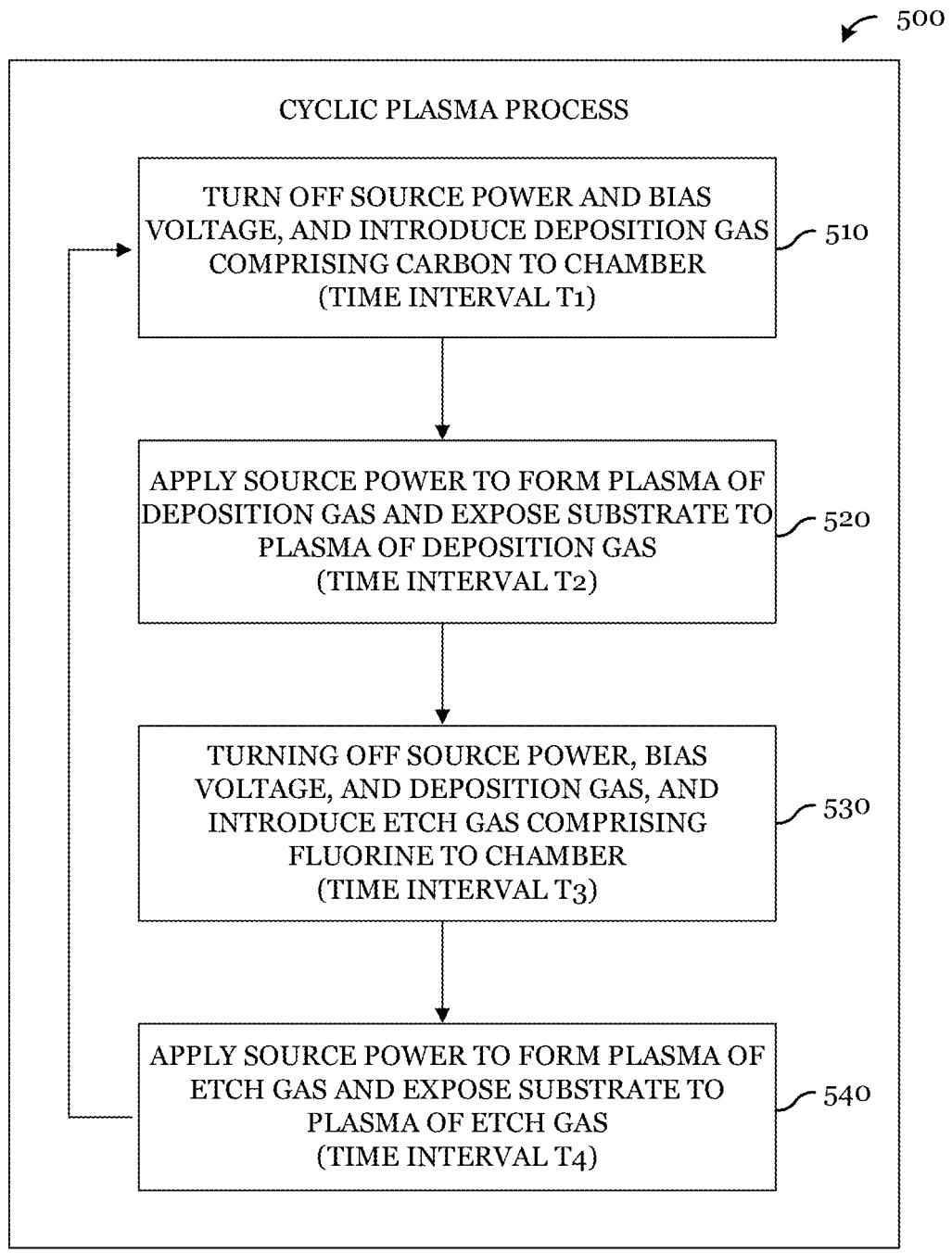

FIG. 5B illustrates a flow diagram of the cyclic plasma process in accordance with the embodiment in FIG. 5A. At a first time interval (T1) (block 510), a source power and a bias power are turned off if they are on, a deposition gas comprising carbon and a diluent gas is introduced to a plasma processing chamber housing a substrate at a first gas flow rate to purge the plasma processing chamber. At a second time interval (T2) (block 520), the source power is applied at a first level to form a plasma of the deposition gas and the substrate is exposed to the plasma of the deposition gas. At a third time interval (T3) (block 530), the source power, the first bias power, and the deposition gas are turned off, and an etch gas comprising tetrafluoromethane ($CF_4$), nitrogen trifluoride ($NF_3$), fluoroform ($CHF_3$), difluoromethane ($CH_2F_2$), or fluoromethane ($CH_3F$), and the diluent gas is introduced to the plasma chamber at a second gas flow rate to purge the plasma processing chamber. Lastly, at a fourth time interval (T4) (block 540), the source power is applied at a second level to form a plasma of the etch gas and the substrate is exposed to the plasma of the etch gas.

FIG. 6 illustrates a plasma system 600 for performing a time-multiplexed implementation of the cyclic plasma etch process, for example illustrated in the flow diagram in FIGS. 4A-4C. The plasma system 600 has a plasma processing chamber 650 configured to sustain plasma directly above a substrate 602 loaded onto a substrate holder 610. A process gas may be introduced to the plasma processing chamber 650 through a gas inlet 622 and may be pumped out of the plasma processing chamber 650 through a gas outlet 624. The gas inlet 622 and the gas outlet 624 may comprise a set of multiple gas inlets and gas outlets, respectively. The gas flow rates and chamber pressure may be controlled by a gas flow control system 620 coupled to the gas inlet 622 and the gas outlet 624. The gas flow control system 620 may comprise various components such as high pressure gas canisters, valves (e.g., throttle valves), pressure sensors, gas flow sensors, vacuum pumps, pipes, and electronically programmable controllers. An RF bias power source 634 and an RF source power source 630 may be coupled to respective electrodes of the plasma processing chamber 650. The substrate holder 610 may also be the electrode coupled to the RF bias power source 634. The RF source power source 630 is shown coupled to a helical electrode 632 coiled around a dielectric sidewall 616. In FIG. 6, the gas inlet 622 is an opening in a top plate 612 and the gas outlet 624 is an opening in a bottom plate 614. The top plate 612 and bottom plate 614 may be conductive and electrically connected to the system ground (a reference potential).

The plasma system 600 is by example only. In various alternative embodiments, the plasma system 600 may be configured to sustain inductively coupled plasma (ICP) with RF source power coupled to a planar coil over a top dielectric cover, or capacitively coupled plasma (CCP) sustained using a disc-shaped top electrode in the plasma processing chamber 650. Gas inlets and outlets may be coupled to sidewalls of the plasma processing chamber, and pulsed RF power sources and pulsed DC power sources may also be used in some embodiments.

FIGS. 7A and 7B illustrates a plasma system 700 for performing a spatially segregated implementation of the cyclic plasma process, wherein FIG. 7A is a top view and FIG. 7B is a cross-sectional view. In the plasma system 700, the four components of each cycle may be performed in four spatially segregated sections of a spatial plasma processing chamber 740. The four components of each cycle of the cyclic plasma etch process may be performed by moving the substrate through the four spatially segregated sections of the spatial plasma processing chamber 740 using for example, a rotatable stage 710.

In the top view illustrated in FIG. 7A, the rotatable stage 710 is segregated into four sections, a first purge section 745, a first plasma section 750, a second purge section 755, and a second plasma section 760. The four sections may be separated by, for example, inert gas curtains 730. Each section may comprise one or more gas inlets and outlets. In FIG. 7A, the first plasma section 750 has a gas inlet 752 and a gas outlet 724, the second plasma section 760 has a gas inlet 723 and a gas outlet 725, and the two purge sections 745 and 755 have gas inlets 720 and gas outlets 726. The purge with the deposition gas (block 451 in FIGS. 4A-4D) may be performed in the first purge section 745, the area-selective plasma deposition (block 452 in FIGS. 4A-4D) in the first plasma section 750, the purge with the etch gas (block 455 in FIGS. 4A-4D) in the second purge section 755, and the plasma etch (block 456 in FIGS. 4A-4D) in the second plasma section 760.

For example, illustrated in FIG. 7A, a plurality of substrates may be loaded on the rotatable stage 710. A first substrate 702, shown loaded on the rotatable stage 710 in the first plasma section 750, may be undergoing the deposition step of one cycle of the plurality of cycles of the cyclic plasma etch process, and then moved to the second purge section 755, followed by a next plasma etch step. Simultaneously, another substrate 704, after a plasma etch step, moving back to the first purge section 745, followed by a plasma deposition step in the next cycle. Accordingly, a plurality of substrates may be undergoing different steps of the cyclic plasma process at the same time. One revolution of the rotatable stage 710 would be equivalent of performing one cycle of the cyclic plasma etch process.

In the cross-sectional view illustrated in FIG. 7B, the plasma sections 750 and 760 are visible. In the example spatial plasma processing chamber 740, the plasma sections 750 and 760 are configured to sustain capacitively coupled plasma (CCP) using top electrodes 712 coupled to RF power sources 714. In the example embodiment illustrated in FIG. 7B, the rotatable stage 710 has been electrically coupled to ground. The grounded rotatable stage 710 may serve as a bottom electrode. The gas outlets 724, 725, and 726 may be connected to vacuum pumps of a gas flow system and controlled to maintain desired pressure and gas flow for the corresponding section. One of the inert gas curtains 730 is indicated schematically by a dashed line. The inert curtain 730 may be a flow of an inert gas (e.g., argon or helium) introduced through one of the gas inlets 720.

Example embodiments of the invention are summarized here. Other embodiments can also be understood from the entirety of the specification as well as the claims filed herein.

Example 1. A method for processing a substrate, the method including: performing a cyclic plasma process including a plurality of cycles, each cycle of the plurality of cycles including purging a plasma processing chamber including the substrate with a first deposition gas including carbon, the substrate including a first layer including silicon and a second layer including a metal oxide; exposing the substrate to a first plasma generated from the first deposition gas to selectively deposit a first polymeric film over the first layer relative to the second layer; purging the plasma processing chamber with an etch gas including fluorine; and exposing the substrate to a second plasma generated from the etch gas to etch the second layer.

Example 2. The method of example 1, where the substrate includes a third layer including silicon and oxygen, the third layer being a different material than the first layer, and where the first polymeric film is selectively deposited over the third layer relative to the second layer during exposing the substrate to the first plasma.

Example 3. The method of one of examples 1 or 2, further including exposing the substrate to a third plasma generated from a second deposition gas including carbon to selectively deposit a second polymeric film over a third layer relative to the second layer.

Example 4. The method of one of examples 1 to 3, further including before the cyclic plasma process, performing a pretreatment step to modify a composition of surface terminal groups of the first layer or the second layer.

Example 5. The method of one of examples 1 to 4, where exposing the substrate to the plasma of the deposition gas and exposing the substrate to the plasma of the etch gas are separated temporally by time-multiplexed processing in a fixed zone of the plasma processing chamber.

Example 6. The method of one of examples 1 to 5, where exposing the substrate to the plasma of the deposition gas and exposing the substrate to the plasma of the etch gas are separated spatially in segregated sections of the plasma processing chamber.

Example 7. The method of one of examples 1 to 6, where the first layer includes silicon nitride or silicon dioxide, and where the second layer includes aluminum oxide.

Example 8. The method of one of examples 1 to 7, further including: maintaining the substrate at a first temperature during the exposing to the first plasma; and maintaining the substrate at a second temperature during the exposing to the second plasma, the second temperature being different from the first temperature.

Example 9. The method of one of examples 1 to 8, where the first deposition gas includes methane ($CH_4$), and where the etch gas includes tetrafluoromethane ($CF_4$), nitrogen trifluoride ($NF_3$), fluoroform ($CHF_3$), difluoromethane ($CH_2F_2$), or fluoromethane ($CH_3F$).

Example 10. The method of one of examples 1 to 9, where the first deposition gas further includes an admixture including hydrogen ($H_2$), argon (Ar), or nitrogen ($N_2$).

Example 11. A method of processing a substrate, the method including: performing a cyclic plasma process including a plurality of cycles, one cycle of the plurality of cycles including: applying, during a first time interval, a first source power to a source electrode of a plasma processing chamber and a first bias power to a bias electrode of the plasma processing chamber and flowing a deposition gas including carbon into the plasma processing chamber to selectively deposit a polymeric film over a silicon-containing layer relative to a metal oxide layer; purging, during a second time interval, the plasma processing chamber with an etch gas including fluorine; and applying, during a third time interval, a second source power to the source electrode and a second bias power to the bias electrode and flowing the etch gas into the plasma processing chamber to etch the metal oxide layer, the first layer being covered under the polymeric film during the third interval.

Example 12. The method of example 11, where the cycle of the plurality of cycles further includes: purging, during a fourth time interval, the plasma processing chamber with the deposition gas.

Example 13. The method of one of examples 11 or 12, the first source power is higher than the second source power and the second bias power is higher than the first bias power.

Example 14. The method of one of examples 11 to 13, where the cycle of the plurality of cycles further includes: flowing a diluent gas through the plasma processing chamber over the first, the second, the third time intervals, a flow rate of the diluent gas being higher during the second interval than the first interval.

Example 15. The method of one of examples 11 to 14, where the deposition gas includes a hydrocarbon, the diluent gas includes argon, the etch gas includes tetrafluoromethane ($CF_4$), nitrogen trifluoride ($NF_3$), fluoroform ($CHF_3$), difluoromethane ($CH_2F_2$), or fluoromethane ($CH_3F$).

Example 16. The method of one of examples 11 to 15, where the metal oxide layer includes aluminum oxide.

Example 17. The method of one of examples 11 to 16, where the third time interval is selected to completely remove the polymeric film.

Example 18. A method for processing a substrate, the method including: performing a cyclic plasma process including a plurality of cycles, each cycle of the plurality of cycles including: purging a plasma processing chamber including the substrate with a deposition gas including carbon, the substrate including a hard mask and an interlevel dielectric (ILD) layer patterned over a metal oxide etch stop layer (ESL) covering a metal line, the hard mask, the ILD layer, and the metal oxide ESL including an outer exposed surface; performing an area-selective plasma deposition process by exposing the substrate to a first plasma generated from the deposition gas to deposit a polymeric film preferentially over the hard mask and the ILD layer relative to the metal oxide ESL; purging the plasma processing chamber with an etch gas including fluorine; and performing an etching process by exposing the substrate to a second plasma generated from the etch gas to preferentially etch the metal oxide ESL relative to the hard mask and the ILD layer.

Example 19. The method of example 18, where the metal oxide ESL includes aluminum oxide, and where the deposition gas includes methane, and where the etch gas includes tetrafluoromethane ($CF_4$), nitrogen trifluoride ($NF_3$), fluoroform ($CHF_3$), difluoromethane ($CH_2F_2$), or fluoromethane ($CH_3F$).

Example 20. The method of one of examples 18 or 19, where the cyclic plasma process is a part of a dual damascene process.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for processing a substrate, the method comprising:
    performing a cyclic plasma process comprising a plurality of cycles, each cycle of the plurality of cycles comprising
        purging a plasma processing chamber comprising the substrate with a first deposition gas comprising methane, ethane, or ethylene, the substrate comprising a silicon-containing hardmask layer and a metal oxide layer, the silicon-containing hardmask layer comprising a first outer surface and the metal oxide layer comprising a second outer surface;
        exposing the first and the second outer surfaces to a first plasma generated from the first deposition gas to selectively deposit a first polymeric film over the silicon-containing hardmask layer relative to the metal oxide layer;

stopping the exposing to the first plasma and purging the plasma processing chamber with an etch gas comprising fluorine; and exposing the substrate to a second plasma generated from the etch gas to etch the metal oxide layer, the first polymeric film protecting the silicon-containing hardmask layer from being etched by the second plasma.

2. The method of claim 1, wherein the substrate comprises a third layer comprising silicon and oxygen, the third layer comprising a third outer surface exposed to the first plasma, the third layer being a different material than the silicon-containing hardmask layer, and wherein the first polymeric film is selectively deposited over the third layer relative to the metal oxide layer during exposing the substrate to the first plasma.

3. The method of claim 2, further comprising
exposing the substrate to a third plasma generated from a second deposition gas comprising carbon to selectively deposit a second polymeric film over the third layer relative to the metal oxide layer.

4. The method of claim 1, further comprising
before the cyclic plasma process, performing a pretreatment step to modify a composition of surface terminal groups of the silicon-containing hardmask layer or the metal oxide layer.

5. The method of claim 1, wherein exposing the substrate to the first plasma of the deposition gas and exposing the substrate to the second plasma of the etch gas are performed in a fixed zone of the plasma processing chamber and separated temporally.

6. The method of claim 1, wherein exposing the substrate to the plasma of the deposition gas and exposing the substrate to the plasma of the etch gas are separated spatially in segregated sections of the plasma processing chamber.

7. The method of claim 1, wherein the silicon-containing hardmask layer comprises silicon nitride or silicon dioxide, and wherein the metal oxide layer comprises aluminum oxide.

8. The method of claim 1, further comprising:
maintaining the substrate at a first temperature during the exposing to the first plasma; and
maintaining the substrate at a second temperature during the exposing to the second plasma, the second temperature being different from the first temperature.

9. The method of claim 1, wherein the first deposition gas comprises methane (CH4), and wherein the etch gas comprises tetrafluoromethane (CF4), nitrogen trifluoride (NF3), fluoroform (CHF3), difluoromethane (CH2F2), or fluoromethane (CH3F).

10. The method of claim 1, wherein the first deposition gas further comprises an admixture comprising hydrogen (H2), argon (Ar), or nitrogen (N2).

11. A method of processing a substrate, the method comprising:
performing a cyclic plasma process to selectively etch a metal oxide layer of the substrate, the substrate comprising a silicon-containing layer, the cyclic plasma process comprising a plurality of cycles, one cycle of the plurality of cycles comprising:
applying, during a first time interval, a first source power to a source electrode of a plasma processing chamber and a first bias power to a bias electrode of the plasma processing chamber and flowing a deposition gas comprising methane, ethane, or ethylene into the plasma processing chamber to selectively deposit a polymeric film over the silicon-containing layer relative to the metal oxide layer;

during a second time interval, stopping the flowing of the deposition gas and the applying of the first source power and the first bias power, and purging the plasma processing chamber with an etch gas comprising fluorine; and applying, during a third time interval, a second source power to the source electrode and a second bias power to the bias electrode and flowing the etch gas into the plasma processing chamber to etch the metal oxide layer, the silicon-containing layer being covered under the polymeric film during the third interval.

12. The method of claim 11, the first source power is higher than the second source power and the second bias power is higher than the first bias power.

13. The method of claim 11, wherein the cycle of the plurality of cycles further comprises:
flowing a diluent gas through the plasma processing chamber over the first, the second, the third time intervals, a flow rate of the diluent gas being higher during the second interval than the first interval.

14. The method of claim 11, wherein the deposition gas comprises argon, and the etch gas comprises tetrafluoromethane (CF4), nitrogen trifluoride (NF3), fluoroform (CHF3), difluoromethane (CH2F2), or fluoromethane (CH3F).

15. The method of claim 11, wherein the metal oxide layer comprises aluminum oxide.

16. The method of claim 11, wherein the third time interval is selected to completely remove the polymeric film.

17. A method for processing a substrate, the method comprising:
performing a cyclic plasma process comprising a plurality of cycles, each cycle of the plurality of cycles comprising:
purging a plasma processing chamber comprising the substrate with a deposition gas comprising fluorine-free hydrocarbon, the substrate comprising a hard mask and an interlevel dielectric (ILD) layer patterned over a metal oxide etch stop layer (ESL) covering a metal line, the hard mask, the ILD layer, and the metal oxide ESL comprising an outer exposed surface;
performing an area-selective plasma deposition process by exposing the substrate to a first plasma generated from the deposition gas to deposit a polymeric film preferentially over the hard mask and the ILD layer relative to the metal oxide ESL;
after performing the area-selective plasma deposition process, purging the plasma processing chamber with an etch gas comprising fluorine; and
after purging the plasma processing chamber, performing an etching process by exposing the substrate to a second plasma generated from the etch gas to preferentially etch the metal oxide ESL relative to the hard mask and the ILD layer.

18. The method of claim 17, wherein the metal oxide ESL comprises aluminum oxide, and wherein the deposition gas comprises methane, and wherein the etch gas comprises tetrafluoromethane (CF4), nitrogen trifluoride (NF3), fluoroform (CHF3), difluoromethane (CH2F2), or fluoromethane (CH3F).

19. The method of claim 1, wherein the first and second outer surfaces are parallel to each other.

20. The method of claim 11, wherein the cycle of the plurality of cycles further comprises:
   purging, during a fourth time interval, the plasma processing chamber with the deposition gas.

* * * * *